US008110831B2

(12) United States Patent
Ono et al.

(10) Patent No.: US 8,110,831 B2
(45) Date of Patent: Feb. 7, 2012

(54) DISPLAY DEVICE HAVING A POLYCRYSTAL PHOSPHOR LAYER SANDWICHED BETWEEN THE FIRST AND SECOND ELECTRODES

(75) Inventors: Masayuki Ono, Osaka (JP); Shogo Nasu, Hyogo (JP); Toshiyuki Aoyama, Osaka (JP); Eiichi Satoh, Osaka (JP); Reiko Taniguchi, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 12/527,788

(22) PCT Filed: Feb. 21, 2008

(86) PCT No.: PCT/JP2008/000293

§ 371 (c)(1),
(2), (4) Date: Aug. 19, 2009

(87) PCT Pub. No.: WO2008/102559

PCT Pub. Date: Aug. 28, 2008

(65) Prior Publication Data

US 2010/0308332 A1 Dec. 9, 2010

(30) Foreign Application Priority Data

Feb. 23, 2007 (JP) ................................ 2007-043956
Feb. 27, 2007 (JP) ................................ 2007-046986

(51) Int. Cl.
*H01L 33/16* (2010.01)

(52) U.S. Cl. ................................ 257/59; 257/E33.004

(58) Field of Classification Search .................... 257/49, 257/52, 59, E21.158, E33.004; 438/29, 690; 501/154; 423/324; 252/301.4 R–301.6 S
See application file for complete search history.

(56) References Cited

U.S. PATENT DOCUMENTS

| | | | | |
|---|---|---|---|---|
| 5,432,015 | A | 7/1995 | Wu et al. | |
| 6,104,449 | A * | 8/2000 | Takahashi et al. | 349/40 |
| 6,380,672 | B1 | 4/2002 | Yudasaka | |
| 6,952,023 | B2 * | 10/2005 | Yamazaki et al. | 257/79 |
| 2001/0035716 | A1 * | 11/2001 | Murasko | 313/510 |

(Continued)

FOREIGN PATENT DOCUMENTS

JP 52-033491 3/1977

(Continued)

OTHER PUBLICATIONS

Gurvich et al., Crystal Phosphors for Storage Luminescent Screens, 1992, Russian Chemical Reviews 61 (6), pp. 576-583.*

*Primary Examiner* — Steven Loke
*Assistant Examiner* — David Ziskind
(74) *Attorney, Agent, or Firm* — McDermott Will & Emery LLP

(57) ABSTRACT

A display device is provided with a pair of a first electrode and a second electrode at least one of which is transparent or translucent and a phosphor layer formed so as to be sandwiched between the first electrode and the second electrode, and the phosphor layer has a polycrystal structure made of a first semiconductor substance in which a second semiconductor substance different from the first semiconductor substance is segregated on a grain boundary of the polycrystal structure, and the phosphor layer has a plurality of pixel regions that are selectively allowed to emit light in a predetermined range thereof and non-pixel regions that divide at least one portion of the pixel regions.

22 Claims, 31 Drawing Sheets

U.S. PATENT DOCUMENTS

| | | | |
|---|---|---|---|
| 2003/0025166 | A1 | 2/2003 | Yamazaki et al. |
| 2004/0222429 | A1 | 11/2004 | Yamazaki et al. |
| 2005/0179368 | A1 | 8/2005 | Ryu et al. |
| 2005/0264175 | A1 | 12/2005 | Yamazaki et al. |
| 2006/0091789 | A1 | 5/2006 | Aoyama et al. |
| 2006/0176244 | A1 | 8/2006 | Hori et al. |
| 2006/0181197 | A1 | 8/2006 | Nago et al. |
| 2007/0181890 | A1 | 8/2007 | Yamazaki et al. |
| 2008/0191607 | A1 | 8/2008 | Kawai et al. |

FOREIGN PATENT DOCUMENTS

| | | |
|---|---|---|
| JP | 62-254394 | 11/1987 |
| JP | 7-050197 | 2/1995 |
| JP | 9-320760 | 12/1997 |
| JP | 11-329741 | 11/1999 |
| JP | 2004-177972 | 6/2004 |
| JP | 2005-209651 | 8/2005 |
| JP | 2006-127884 | 5/2006 |
| JP | 2006-191127 | 7/2006 |
| WO | WO 2005/004546 A1 | 1/2005 |
| WO | WO 2005/004548 A1 | 1/2005 |
| WO | WO 2006/025259 A1 | 3/2006 |
| WO | WO 2008/013171 A1 | 1/2008 |
| WO | WO 2008/032737 A1 | 3/2008 |

* cited by examiner

DISPLAY DEVICE HAVING A POLYCRYSTAL PHOSPHOR LAYER SANDWICHED BETWEEN THE FIRST AND SECOND ELECTRODES

RELATED APPLICATIONS

This application is the U.S. National Phase under 35 U.S.C. §371 of International Application No. PCT/JP2008/000293, filed on Feb. 21, 2008, which in turn claims the benefit of Japanese Application Nos. 2007-043956, filed on Feb. 23, 2007 and 2007-046986, filed on Feb. 27, 2007, the disclosures of which Applications are incorporated by reference herein.

BACKGROUND OF THE INVENTION

1. Technical Field

This present invention relates to a display device that uses electroluminescent elements (hereinafter, referred to simply as EL).

2. Background Art

In recent years, among many kinds of flat panel display devices, those display devices that use electroluminescent elements have drawn public expectations. The display device using EL elements has advantages, such as a spontaneous light-emitting property, superior visibility, a wide viewing angle and a high response speed. Moreover, EL elements that have been currently developed include inorganic EL elements in which an inorganic material is used for its illuminant, and organic EL elements in which an organic material is used for its illuminant.

The inorganic EL element using an inorganic phosphor, such as zinc sulfide as an illuminant, has such a structure that electrons, accelerated by an electric field as high as $10^6$V/cm, are made to collide with the luminescence centers of the phosphors so as to be exited and when they are alleviated, light is emitted. The inorganic EL elements include dispersion-type EL elements having a structure in which phosphor powder is dispersed in a polymer organic material or the like with electrodes being formed on the upper and lower sides thereof, and thin-film-type EL elements having a structure in which two dielectric layers are formed between a pair of electrodes with a thin-film phosphor layer being sandwiched between the dielectric layers. Although the dispersion-type EL elements can be easily produced, they have low luminance and short service life, with the result that the application thereof is limited. In contrast, with respect to the thin-film-type EL elements, those elements having a double insulating structure, which have been proposed by Inokuchi et al., in 1974, exhibit high luminance and long service life, and have been put into practical use as displays for use in vehicles, as shown in Japanese Patent Laid-open Publication No. 52-33491.

Referring to FIG. 64, the following description will discuss the conventional inorganic EL element. FIG. 64 is a cross-sectional view obtained when an EL element 50 using a thin-film dielectric member 55 is viewed in a direction perpendicular to the light-emitting face thereof. The EL element 50 has a structure in which a transparent electrode 52, a thin-film dielectric layer 53, a phosphor layer 54, a thick-film dielectric layer 55 and a back electrode 56 are stacked on a substrate 51 in this order. A light emission from the phosphor layer 54 is taken out from the transparent electrode 52 side. The thick-film dielectric layer 55 has a function for regulating an electric current flowing through the phosphor layer 54, can suppress a dielectric breakdown in the EL element 50, and also functions so as to provide a stable light-emitting characteristic.

Moreover, upon configuring a display device by arranging a plurality of EL elements two-dimensionally, a plurality of EL elements aligned over the same row may be made to use the common transparent electrode, and a plurality of EL elements aligned over the same column may be made to use the common back electrode. In this case, one transparent electrode serves as a data electrode that extends in a column direction, and one back electrode serves as a scanning electrode that extends in a row direction so that a plurality of data electrodes that are in parallel with each other and a plurality of scanning electrodes are patterned into stripes that are made orthogonal to each other. By applying a voltage to a specific pixel selected within the matrix of the data electrodes and the scanning electrodes, a display device of a passive matrix driving system, which carries out a desired pattern display, can be obtained.

In this case, however, when the display device using the inorganic EL elements is utilized as a high-quality display device, such as a television, luminance of about 300 cd/m$^2$ or more is required, with the result that the device becomes insufficient from the viewpoint of light emission luminance. Moreover, with a display device of a passive matrix driving system, when the number of the scanning lines increases along with the developments of a high definition system, the luminance is further lowered. Furthermore, in order to drive the above-mentioned inorganic EL element, normally, an AC voltage of about 200V needs to be applied with a high frequency of several kHz, with the result that problems arise in which an active element such as a thin-film transistor is not applicable and in which a high-cost driving circuit is required; therefore, there are still some problems in order to put this system into practical use.

As a result of extensive studies made by the inventors of the present invention to achieve a low voltage and high luminance of the inorganic EL element, the inventors have found an inorganic EL element that can be driven by using a direct current, and emits light with high luminance by using a low voltage of several 10V that is sufficiently low in comparison with the voltage required for the conventional inorganic EL element (hereinafter, referred to as “direct-current driving type inorganic EL element”).

SUMMARY OF THE INVENTION

The direct-current driving type inorganic EL element uses a phosphor layer that has a resistance value in the semiconductor region that is lower by several digits in resistivity than that of a phosphor layer used for the conventional light emitting element. In a case where this EL element is applied to a display device of a simple matrix structure, even when a light emission threshold-value voltage is applied to a scanning electrode $X_i$ and a data electrode $Y_j$, in order to allow only the specific pixel (supposing that this is indicated by $C_{i,j}$) to emit light, a leakage current flows between a scanning electrode $X_{i+1}$ and a data electrode $Y_j$ that form a peripheral pixel (for example, $C_{i+1,j}$), which sometimes causes an erroneous light emission (hereinafter, this phenomenon is referred to as “crosstalk”). In this manner, in contrast to the effect of high luminance, new problems arise in the direct-current driving-type inorganic EL element to be solved upon being put into practical use.

The following display device of a simple matrix type that utilizes organic EL elements using an organic material as its illuminant is exemplified as a device having similar problems described above. In accordance with the technique described in Japanese Patent Laid-open Publication No. 9-320760, a method has been proposed in which, in an organic thin-film EL element, in order to prevent a leakage current in the organic thin-film layer upon emitting light, by applying an excimer laser to the respective layers that have been film-formed from the surface layer side, one or a plurality of electrode layers or organic thin-film layers are patterned so that crosstalk in the matrix-shaped organic thin-film EL element is prevented. In accordance with the technique described in Japanese Patent Laid-open Publication No. 7-50197, although its direct objective is different, a method similar to the method described above has been proposed in which, in a conventional inorganic EL element, by applying a laser beam having a desired wavelength focused from the surface layer side to the respective layers that have been film-formed, one portion of the lower dielectric layer is directly removed, while the phosphor layer, the upper dielectric layer and the transparent electrode, stacked on the upper side of the lower dielectric layer are indirectly removed. In this method, upon forming a stripe-shaped fine pattern of the transparent electrode, the phosphor layer is also simultaneously patterned.

An objective of the present invention is to provide a display device that uses a light-emitting element that can be driven at a low voltage, and has high luminance and high efficiency so that it becomes possible to prevent crosstalk and achieve high display quality.

A display device according to the present invention includes:

a pair of a first electrode and a second electrode, at least one electrode of the first second electrodes being transparent or translucent; and a phosphor layer provided as being sandwiched between the first electrode and the second electrode, wherein the phosphor layer has a polycrystal structure made of a first semiconductor substance in which a second semiconductor substance different from the first semiconductor substance is segregated on a grain boundary of the polycrystal structure, and the phosphor layer has a plurality of pixel regions that are selectively allowed to emit light in a predetermined range thereof and non-pixel regions that divide at least one portion of the pixel regions.

Moreover, the pixel regions and the non-pixel regions may be periodically distributed over the same plane of the phosphor layer with the pixel regions being divided by the non-pixel regions.

Further, the non-pixel regions may be provided to divide the pixel regions into a stripe shape.

Furthermore, the non-pixel regions may include discontinuous regions of the phosphor layer forming the pixel regions.

Moreover, the non-pixel regions may include one portion of the first electrode or the second electrode that divides at least one portion of the phosphor layer forming the pixel regions.

Further, the non-pixel regions may be made of regions having higher resistance than that of the pixel regions.

Furthermore, each of the non-pixel regions may be a void region that is in a vacuum state or filled with a nonvolatile gas. The non-pixel regions may be solid-state regions mainly including an insulating resin.

Moreover, the phosphor layer may contain one or more elements selected from the group consisting of Ag, Cu, Ga, Mn, Al and In, and the non-pixel regions may have a different content density of the element from that of the pixel regions.

Further, the phosphor layer may be made of a compound semiconductor.

Moreover, the non-pixel regions may be formed by amorphous phase.

Further, the pixel regions may be formed by crystalline phase of the material of the phosphor layer, and the non-pixel regions may be formed by amorphous phase of the material of the phosphor layer.

Furthermore, the first semiconductor substance and the second semiconductor substance may have semiconductor structures having respectively different conductive types.

Moreover, the first semiconductor substance may have an n-type semiconductor structure and the second semiconductor substance has a p-type semiconductor structure. The first semiconductor substance and the second semiconductor substance may be compound semiconductors respectively.

Further, the first semiconductor substance may be a compound semiconductor including elements belonging to Group 12 to Group 16.

Furthermore, the first semiconductor substance may have a cubic structure.

Moreover, the first semiconductor substance may contain at least one element selected from the group consisting of Cu, Ag, Au, Al, Ga, In, Mn, CI, Br, I, Li, Ce, Pr, Nd, Pm, Sm, Eu, Gd, Tb, Dy, Ho, Er, Tm and Yb.

Further, the polycrystalline structure made of the first semiconductor substance may have an average crystal grain size in a range from 5 to 50 nm.

Furthermore, the second semiconductor substance may contain at least one element selected from the group consisting of ZnS, ZnSe, ZnSSe, ZnSeTe, ZnTe, GaN and InGaN.

Moreover, the first semiconductor substance may a zinc-based material containing zinc. In this case, at least one of the electrodes may be made of a material containing zinc.

Further, the material containing zinc forming one of the electrodes may mainly include zinc oxide, and contain at least one element selected from group consisting of aluminum, gallium, titanium, niobium, tantalum, tungsten, copper, silver and boron.

Furthermore, the display device according to the present invention may include a supporting substrate that faces at least one of the electrodes, and supports the electrodes. The display device according to the present invention may further include a color conversion layer provided as being parallel to the electrode, and the color conversion layer being placed in front thereof in a light emission taking-out direction.

A method for manufacturing a display device includes:

preparing a substrate;

forming a first electrode on the substrate;

forming a phosphor layer on the first electrode;

by carrying out a laser annealing process on one portion of the phosphor layer, defining crystalline pixel regions and amorphous non-pixel regions in a divided manner; and forming a second electrode that is transparent or translucent on the phosphor layer.

A display device according to the present invention includes:

a pair of a first electrode and a second electrode, at least one electrode of the first and second electrodes being transparent or translucent; and a phosphor layer having a p-type semiconductor and an n-type semiconductor, the phosphor layer being sandwiched between the first electrode and the second electrode, wherein the phosphor layer has a plurality of pixel regions that are selectively allowed to emit light in a predetermined range thereof and non-pixel regions that divide at least one portion of the pixel regions.

The phosphor layer may have a structure in which n-type semiconductor particles are dispersed in a medium made of a p-type semiconductor. Further, the phosphor layer may include an aggregated body of n-type semiconductor particles with a p-type semiconductor being segregated between the particles.

Moreover, the n-type semiconductor particles may be electrically joined to the first and second electrodes through the p-type semiconductor.

Further, the pixel regions and the non-pixel regions may be periodically distributed over the same plane of the phosphor layer with the pixel regions being divided by the non-pixel regions. Furthermore, the non-pixel regions may be provided to divide the pixel regions into a stripe shape.

Moreover, the non-pixel regions may include discontinuous regions of the phosphor layer having the pixel regions.

Further, the non-pixel regions may include one portion of the first electrode or the second electrode that divides at least one portion of the phosphor layer having the pixel regions.

Furthermore, the non-pixel regions may be made of regions having higher resistance than that of the pixel regions.

Moreover, each of the non-pixel regions may be a void region that is in a vacuum state or filled with a nonvolatile gas. The non-pixel regions may be solid-state regions mainly including an insulating resin.

Further, the non-pixel regions may be formed by amorphous phase. The pixel regions may be formed by crystalline phase of the material of the phosphor layer, and the non-pixel regions may be formed by amorphous phase of the material of the phosphor layer.

Furthermore, the n-type semiconductor particles and the p-type semiconductor may be compound semiconductors respectively. The n-type semiconductor particles may be made of a compound semiconductor including elements belonging to Group 12 to Group 16. The n-type semiconductor particles may be made of a compound semiconductor including elements belonging to Group 13 to Group 15.

The n-type semiconductor particles may be made of a chalco-pyrite-type compound semiconductor.

The n-type semiconductor particles may be made of at least one element selected from the group consisting of ZnS, ZnSe, ZnSSe, ZnSeTe, ZnTe, GaN and InGaN.

Further, the n-type semiconductor particles may be made of a zinc-based material containing zinc. In this case, at least one of the first and second electrodes may be made of a material containing zinc.

Moreover, the material containing zinc forming one of the electrodes may mainly include zinc oxide, and contain at least one element selected from group consisting of aluminum, gallium, titanium, niobium, tantalum, tungsten, copper, silver and boron.

Furthermore, the display device according to the present invention may include: a supporting substrate that faces at least one of the electrodes between the first and second electrodes, and supports the electrodes.

Moreover, the display device according to the present invention may include a color conversion layer provided as being parallel to the first electrode and the second electrode respectively, and the color conversion layer is placed in front thereof in a light emission taking-out direction from the phosphor layer.

In accordance with the present invention, it is possible to provide a display device that uses a light-emitting element that can be driven at a low voltage, and has high luminance and high efficiency, the display device making it possible to prevent crosstalk and consequently to achieve high display quality.

In accordance with the display device of the present invention, the phosphor layer has a polycrystal structure made of an n-type semiconductor substance with a p-type second semiconductor substance being segregated on the grain boundary of the polycrystal structure. Since the phosphor layer has such a structure, the injection characteristic of holes is improved by the p-type semiconductor substance segregated on the grain boundary so that it possible to achieve a display device that can emit light at a low voltage with high luminance, and also has a long service life.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
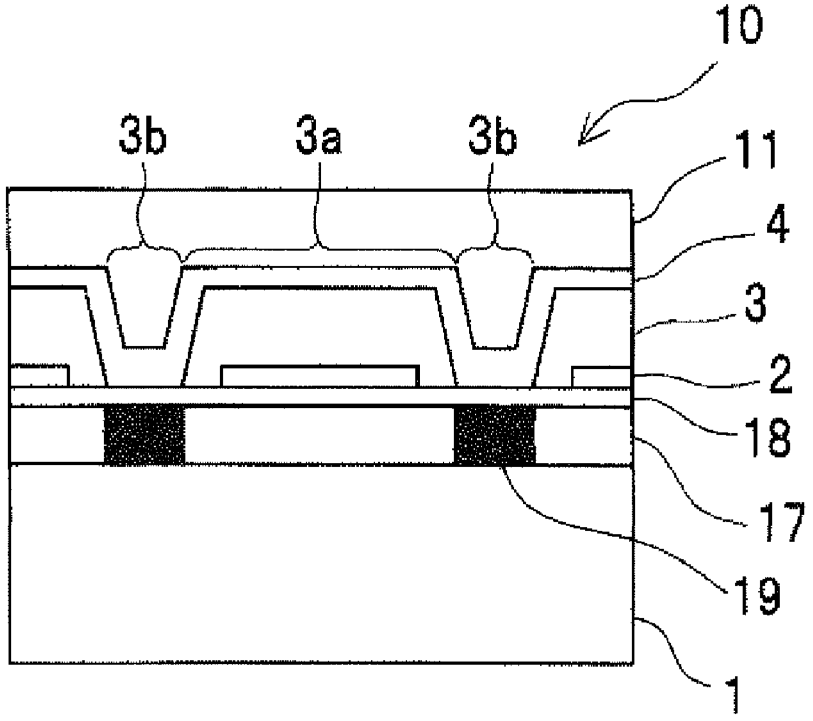
FIG. 1 is a schematic cross-sectional view that shows a structure of a display device in accordance with first embodiment of the present invention.

Referring to attached drawings, the following description will discuss a display device in accordance with embodiments of the present invention. In the drawings, those members that are virtually the same are indicated by the same reference numerals.

First Embodiment

<Schematic Structure of Display Device>

Figure 2:
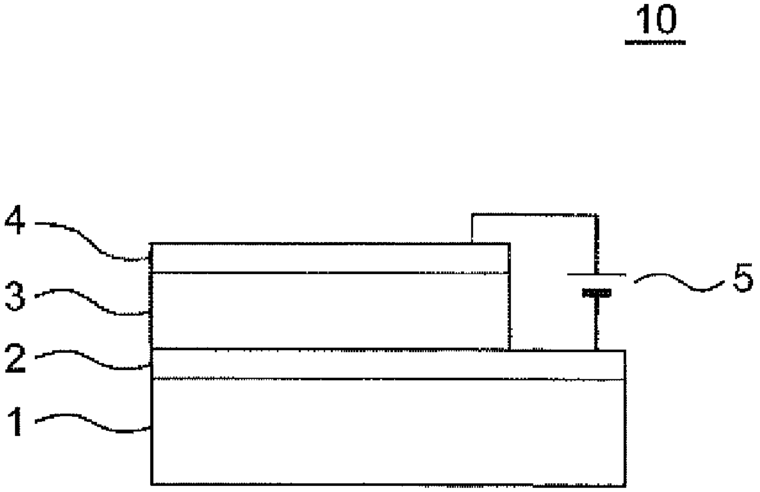
FIG. 2 is a schematic cross-sectional view that shows a structure of a single pixel in the display device of FIG. 1.

FIG. 1 is a schematic cross-sectional view that shows a cross-sectional structure of a display device 10 in accordance with first embodiment of the present invention. FIG. 2 is a schematic cross-sectional view that shows a structure of a single pixel in the display of FIG. 1. In this display device 10, a phosphor layer 3 containing an illuminant is formed between a transparent electrode 2 serving as a first electrode and a back electrode 4 serving as a second electrode. A transparent substrate 1, which supports these electrodes, is formed adjacent to the transparent electrode 2. The transparent electrode 2 and the back electrode 4 are electrically connected to each other with a power supply 5 interposed therebetween. When power is supplied from the power supply 5, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2 and the transparent substrate 1, and is taken out from the display device 10. In the present embodiment, a DC power supply is used as the power supply 5.

Figure 3:
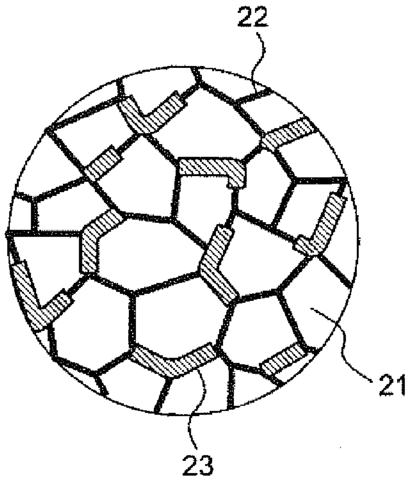
FIG. 3 is an enlarged view that shows a phosphor layer of FIG. 2.

FIG. 3 is a schematic enlarged view that shows the phosphor layer 3. In this display device 10, as shown in FIG. 3, the phosphor layer 3 has a polycrystal structure made of a first semiconductor substance 21, in which a second semiconductor substance 23 is segregated on the grain boundary 22 of the polycrystal structure. In the present embodiment, the first semiconductor substance 21 is an n-type semiconductor substance, and the second semiconductor substance 23 is a p-type semiconductor substance. Thus, the injection characteristic of holes is improved by the p-type semiconductor substance segregated on the grain boundary of the n-type semiconductor substance so that the recombination-type light emission of electrons and holes can be efficiently generated, making it possible to achieve a display device 10 that can emit light at a low voltage with high luminance.

Moreover, as shown in FIG. 1, in the display device 10, a plurality of pixel regions 3*a* capable of selectively emitting light are disposed two-dimensionally in the phosphor layer 3. The respective pixel regions 3*a* are selected by a combination of the transparent electrode 2 and the back electrode 4, and allowed to emit light. Moreover, the respective pixel regions 3*a* are also divided by non-pixel regions 3*b*. The non-pixel regions 3*b* are formed by discontinuous portions of the phosphor layer 3. The back electrode 4 is formed on one portion of the discontinuous portions within the interpixel regions in a manner so as to surround each pixel region 3*a*. Moreover, the display device 10 is further provided with a color filter 17 between the transparent electrode 2 and the transparent substrate 1. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB.

Additionally, not limited to the above-mentioned structure, for example, another structure may be used in which a plurality of phosphor layers 3 are formed, both of the first and second electrode are prepared as the transparent electrodes, the back electrode 4 is prepared as a black-colored electrode, a structure for sealing the entire portion or one portion of the display device 10 is further provided, or a color-converting structure that converts the color of light emission from the phosphor layer 3 is further prepared in front of the color filter 17.

The following description will discuss the respective components of this display device 10.

<Substrate>

A material that can support respective layers formed thereon, and also has a high electric insulating property is used as the transparent substrate 1. Moreover, the material needs to have a light transmitting property to a light wavelength that is emitted from the phosphor layer 3. Examples of the material include glass, such as corning 1737, quartz, ceramics and the like. In order to prevent alkaline ion or the like, contained in normal glass, from giving adverse effects to the light-emitting device, non-alkaline glass, or soda lime glass, formed by coating alumina or the like as an ion barrier layer on the glass surface, may be used. However, these materials are exemplary only, and the material of the transparent substrate 1 is not particularly limited by these. Moreover, with a structure in which no light is taken out from the substrate side, the above-mentioned light transmitting property is not required, and a material having no light transmitting property may also be used. Examples of the material include a metal substrate, a ceramic substrate, a silicon wafer and the like with an insulating layer being formed on the surface thereof.

<Electrode>

Any material may be used as the transparent electrode 2 on the side from which light is taken out as long as it has a light-transmitting property so as to take light emission generated in the phosphor layer 3 out of the layer, and in particular, those materials having a high transmittance within a visible light range are desirably used. Moreover, those materials that exert low resistance are preferably used, and in particular, those materials having a superior adhesive property to a protective layer 18 and the phosphor layer 3 are desirably used. In particular, preferable examples of materials for the transparent electrode 2 include those ITO materials ($In_2O_3$ doped with $SnO_2$, referred to also as indium tin oxide), metal oxides mainly including InZnO, ZnO, $SnO_2$ or the like, metal thin films such as Pt, Au, Pd, Ag, Ni, Cu, Al, Ru, Rh, and Ir, or conductive polymers, such as polyaniline, polypyrrole, PEDOT/PSS and polythiophene; however, the material is not particularly limited by these.

For example, the ITO material may be formed into a film by using a film-forming method, such as a sputtering method, an electron beam vapor deposition method and an ion plating method so as to improve the transparency thereof or to lower the resistivity thereof. Moreover, after the film-forming process, the film may be surface-treated by a plasma treatment or the like so as to control the resistivity thereof. The film thickness of the transparent electrode 2 is determined based upon the sheet resistance value and visible light transmittance to be required.

Moreover, any of generally well-known conductive materials may be applied as the back electrode 4 on the side from which no light is taken out. Preferable examples thereof include metal oxides, such as ITO, InZnO, ZnO and $SnO_2$, metals, such as Pt, Au, Pd, Ag, Ni, Cu, Al, Ru, Rh and Ir, or conductive polymers, such as polyaniline, polypyrrole and PEDOT[poly(3,4-ethylenedioxythiophene)]/PSS(polystyrene sulfonate), or conductive carbon.

The transparent electrode 2 and the back electrode 4 may have a structure in which a plurality of electrodes are formed into a striped pattern within the layer. Moreover, both of the transparent electrodes 2 (first electrodes) and the back electrodes 4 (second electrodes) may be formed into a plurality of stripe-shaped electrodes with the respective striped-shaped electrodes of the first electrodes 2 and all the stripe-shaped electrodes of the second electrodes 4 being set to a twisted positional relationship, and with projected shapes onto the light-emitting face of the respective stripe-shaped electrodes of the first electrodes 2 and projected shapes onto the light emitting face of all the stripe-shaped electrodes of the second electrodes 4 being made to intersect with one another. In this case, it is possible to obtain a display in which, by applying a voltage to electrodes respectively selected from the stripe-shaped electrodes of the first electrodes and the stripe-shaped electrodes of the second electrodes, a predetermined position is allowed to emit light.

<Phosphor Layer>

The following description will discuss the phosphor layer 3. FIG. 3 is a schematic structural view in which one portion of the cross section of the phosphor layer 3 is enlarged. The phosphor layer 3 has a polycrystal structure made of the first semiconductor substance 21, in which the second semiconductor substance 23 is segregated on the grain boundary 22 of the polycrystal structure. As the first semiconductor substance 21, a semiconductor material that has majority carriers being electrons, and exhibits an n-type conductivity is used. On the other hand, as the second semiconductor substance 23, a semiconductor material that has majority carriers being holes, and exhibits a p-type conductivity is used. Here, the first semiconductor substance 21 and the second conductive substance 23 are electrically joined to each other.

As the first semiconductor substance 21, those materials having a band gap size ranging from a near ultraviolet area to a visible light area (from 1.7 eV to 3.6 eV) are preferably used, and more preferably, those materials having a band gap size ranging from the near ultraviolet area to a blue color area (from 2.6 eV to 3.6 eV) are used. Specific examples thereof include: the aforementioned compounds between Group 12 to Group 16 elements, such as ZnS, ZnSe, ZnTe, CdS and CdSe, and mixed crystals of these (for example, ZnSSe or the like), compounds between Group II to Group 16 elements, such as CaS and SrS, and mixed crystals of these (for example, CaSSe or the like), compounds between Group 13 to Group 15 elements, such as AlP, AlAs, GaN and GaP, and mixed crystals of these (for example, InGaN or the like), and mixed crystals of the above-mentioned compounds, such as ZnMgS, CaSSe and CaSrS. Moreover, chalcopyrite-type compounds, such as $CuAlS_2$, may be used. Furthermore, as the polycrystal material made of the first semiconductor substance 21, those having a cubic crystal structure in the main portion thereof are preferably used. Here, one or a plurality of kinds of atoms or ions, selected from the group consisting of the following elements, may be contained as additives: Cu, Ag, Au, Ir, Al, Ga, In, Mn, CI, Br, I, Li, Ce, Pr, Nd, Pm, Sm, Eu, Gd, Tb, Dy, Ho, Er, Tm and Yb. The light emission color from the phosphor layer 3 is also determined by the kinds of these elements.

As the second semiconductor substance 23, any one of $Cu_2S$, ZnS, ZnSe, ZnSSe, ZnSeTe, ZnTe, GaN and InGaN may be used. These materials may contain one kind or a plurality of kinds of elements, selected from N, Cu and In, as additives used for imparting the p-type conductivity thereto.

The feature of the display device 10 relating to first embodiment lies in that the phosphor layer 3 has a polycrystal structure made of the n-type semiconductor substance 21 with the p-type semiconductor substance 23 being segregated on the grain boundary 22 of the polycrystal structure. In the conventional inorganic EL, by enhancing the crystallinity of the phosphor layer, electrons accelerated by a high electric field are prevented from being diffused; however, in general, since ZnS, ZnSe or the like exhibits the n-type conductivity, a supply of holes is not sufficient, with the result that light emission with high luminance derived from a recombination of an electron and a hole is not expected. In contrast, when the crystal grains of the phosphor layer are grown, the crystal grain boundary is uniquely expanded as well, as long as it is not a single crystal. With a conventional inorganic EL element to which a high voltage is applied, the grain boundary in the film thickness direction forms a conductive path, resulting in a problem of a reduction in voltage resistance. In contrast, after hard studies, the present inventors have found that, in a phosphor layer 3 having a polycrystal structure made of the n-type semiconductor substrate 21, by providing a structure in which the p-type semiconductor substance 23 is segregated on the grain boundary 22 of the polycrystal structure, the injecting property of holes is improved by the p-type semiconductor substance segregated on the grain boundary. Moreover, they have also found that by scattering the segregated portions in the phosphor layer 3 with a high concentration, the recombination-type light emission of electrons and holes can be efficiently generated. Thus, it becomes possible to achieve a light emitting device that emits light with high luminance at a low voltage, and consequently to complete the present invention. Moreover, by introducing a donor or an acceptor thereto, free electrons and holes captured by the acceptor can be recombined, free holes and electrons captured by donor can be recombined, and light emission of the paired donor and acceptor can also be carried out. Furthermore, since other kinds of ions are located closely, light emission derived from an energy transfer can also be carried out.

Moreover, in a case where a zinc-based material such as ZnS is used as the first semiconductor particles 21 of the phosphor layer 3, an electrode, made of a metal oxide containing zinc, such as ZnO, AZO (zinc oxide doped with, for example, aluminum) and GZO (zinc oxide doped with, for example, gallium), is preferably used as at least either one of the transparent electrode 2 and the back electrode 4. The present inventors have found that, by adopting a combination of specific n-type semiconductor particles 21 and a specific transparent electrode 2 (or back electrode 4), light emission can be produced with high efficiency.

That is, when attention is drawn to a work function in the transparent electrode 2 (or back electrode 4), the work function of ZnO is 5.8 eV, while the work function of ITO (indium-tin oxide) that has been conventionally used as the transparent electrode is 7.0 eV. In contrast, since the work function of a zinc-based material that is the n-type semiconductor particles 21 of the phosphor layer 3 is 5 to 6 eV, the work function of ZnO is closer to the work function of the zinc-based material in comparison with that of ITO; therefore, the resulting advantage is that the ion injecting property to the phosphor layer 3 is improved. The same is true in a case where AZO or GZO, which is a zinc-based material, is used as the transparent electrode 2 (or back electrode 4) in the same manner.

Figure 4A:
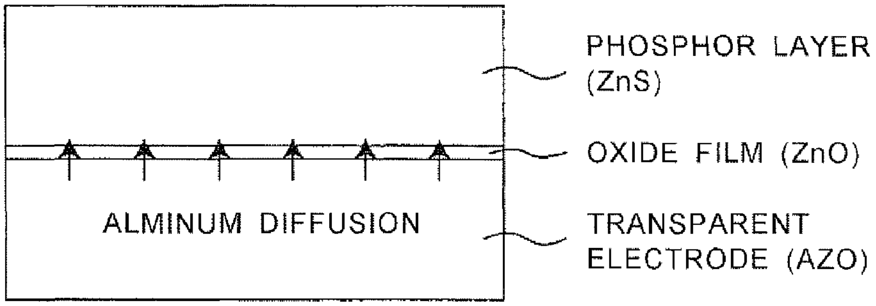
FIG. 4A is a schematic view that shows a proximity of an interface between the phosphor layer made of ZnS and a transparent electrode (or a back electrode) made of AZO.
Figure 4B:
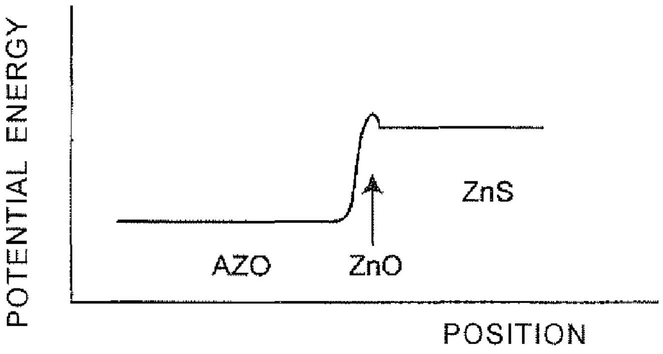
FIG. 4B is a schematic view that shows a displacement in potential energy of FIG. 4A.
Figure 5A:
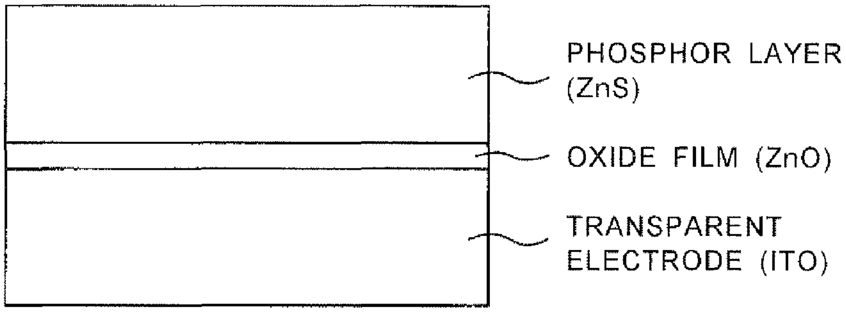
FIG. 5A, which shows a comparative example, is a schematic view that shows an interface between the phosphor layer made of ZnS and a transparent electrode made of ITO.
Figure 5B:
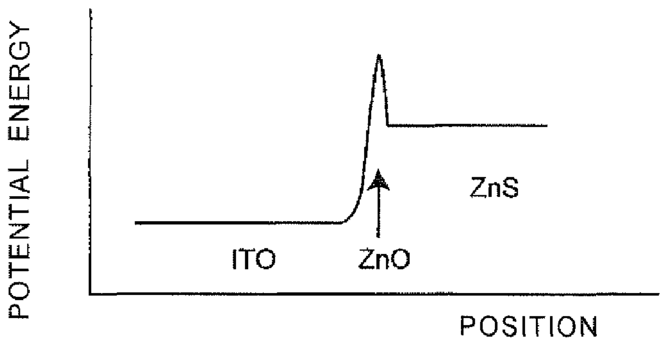
FIG. 5B is a schematic view that shows a displacement in potential energy of FIG. 5A.

FIG. 4A is a schematic view that shows the vicinity of an interface between the phosphor layer 3 made of ZnS and the transparent electrode 2 (or back electrode 4) made of AZO. FIG. 4B is a schematic view that explains the change of potential energy of FIG. 4A. Moreover, FIG. 5A is a schematic view that shows an interface between a phosphor layer 3 made of ZnS and a transparent electrode made of ITO as a comparative example. FIG. 5B is a schematic view that explains the change of potential energy of FIG. 5A.

As shown in FIG. 4A, in the above-mentioned preferable example, since the first semiconductor substrate 21 forming the phosphor layer 3 is made of a zinc-based material (ZnS) and since the transparent electrode 2 (or back electrode 4) is made of a zinc oxide-based material (AZO), an oxide to be formed on the interface between the transparent electrode 2 (or back electrode 4) and the phosphor layer 3 is a zinc oxide (ZnO). Moreover, on the interface, upon forming a film, the doping material (Al) is diffused so that a low resistance oxide film is formed. Moreover, the zinc oxide-based (AZO) transparent electrode 2 (or back electrode 4) has a crystal structure in a hexagonal system, and since the zinc-based material (ZnS) serving as the n-type semiconductor substance 21 forming the phosphor layer 3 also has a hexagonal system or a crystal structure in a cubic system, a strain to be exerted on the interface of the two layers is small to cause a small energy barrier. Consequently, as shown in FIG. 4B, the displacement in potential energy becomes smaller.

In a comparative example, on the other hand, as shown in FIG. 5A, since the transparent electrode is made of ITO that is not a zinc-based material, the oxide film (ZnO) formed on the interface has a different crystal structure from that of ITO so that an energy barrier on the interface becomes larger. Therefore, as shown in FIG. 5B, the change in the potential energy becomes greater on the interface to cause a reduction in the light emitting efficiency of the light emitting device.

As described above, in a case where a zinc-based material, such as ZnS and ZnSe, is used as the n-type semiconductor particles 21 of the phosphor layer 3, by combining the transparent electrode 2 (or back electrode 4) made of a zinc oxide-based material with the semiconductor particles, it becomes possible to provide a display device having superior light emitting efficiency.

Here, in the above-mentioned example, the explanation has been given by exemplifying AZO doped with aluminum and GZO doped with gallium as the transparent electrode 2 (or back electrode 4) containing zinc; however, the same effects can be obtained even by the use of zinc oxide doped with at least one kind selected from the group consisting of aluminum, gallium, titanium, niobium, tantalum, tungsten, copper, silver and boron.

<Manufacturing Method>

The following description will discuss one example of a method for manufacturing the display device 10 in accordance with first embodiment. FIGS. 6 to 9 are schematic perspective views that show the respective processes of the manufacturing method of the present embodiment.

(1) First, a glass substrate is prepared as a transparent substrate 1.

(2) On the glass substrate 1, a black matrix 19 is formed by using a resin material containing carbon black through a photolithography method. The black matrix 19 is disposed virtually in a lattice shape by using a plurality of linear patterns that extend in a first direction in parallel with the surface of the glass substrate 1 with predetermined intervals and a plurality of linear patterns that extend in a direction orthogonal to the first direction with predetermined intervals.

(3) Next, by using color resists, colored patterns are formed between adjacent matrix lines of the black matrix 19 by a photolithography method. These processes are repeatedly carried out for each of the colors of R, G and B so that a color filter 17 is formed.

(4) Next, a protective layer 18 is formed on each of the colored patterns of the color filter 17, and a transparent electrode 2 is formed on the protective layer 18 by a sputtering method. As the material for the transparent electrode 2, ITO is used, and the transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

(5) Next, a phosphor layer 3 having a flat face is formed on the protective layer 18 and the transparent electrode 2 of the color filter 17. The phosphor layer 3 is formed in the following manner. First, powdered ZnS and $Cu_2S$ are respectively charged into a plurality of evaporating sources, and an electron beam is applied to each of the materials under vacuum (about $10^{-6}$ Torr) so as to be film-formed thereon. At this time, the substrate temperature is set to 200° C. so that ZnS and $Cu_2S$ are commonly vapor deposited.

Figure 6:
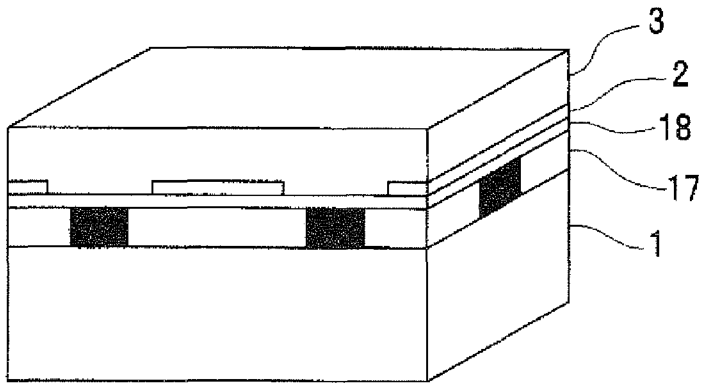
FIG. 6 is a schematic perspective view that shows one process of a method for manufacturing a display device in accordance with first embodiment of the present invention.

(6) After forming the film, this is subjected to a firing process at 700° C. for about one hour in a sulfur atmosphere so that a phosphor layer 3 is obtained. By examining this film by using the X-ray diffraction and the SEM, the polycrystal structure with minute ZnS crystal grains and the segregated portion of $Cu_xS$ on its grain boundary can be observed. Although the reason for this has not been clarified, it is considered that a phase separation occurs between ZnS and $Cu_xS$, with the result that the above-mentioned segregated structure is formed (FIG. 6).

Figure 7:
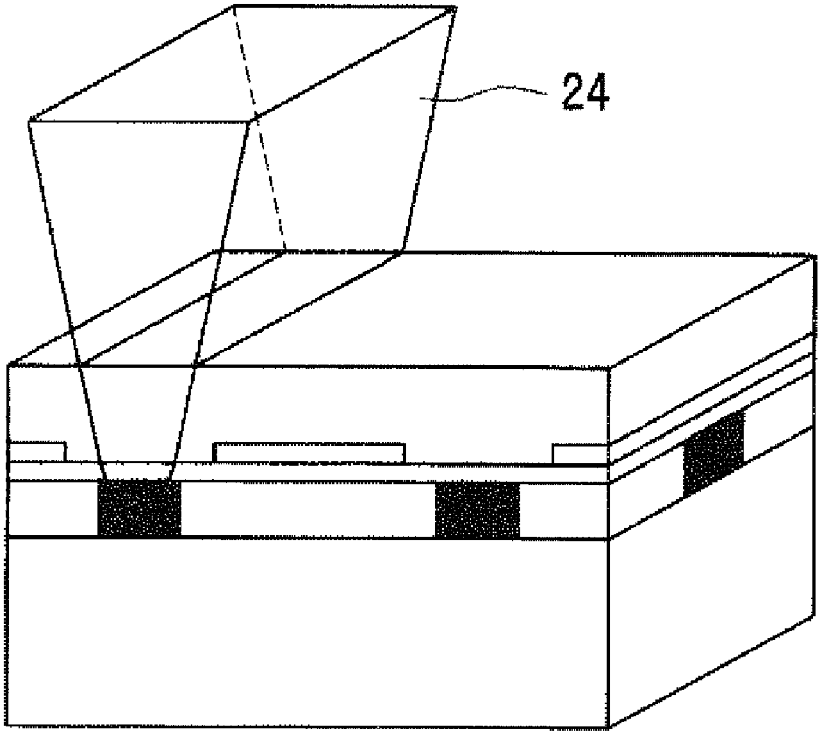
FIG. 7 is a schematic perspective view that shows another process of the method for manufacturing a display device in accordance with first embodiment of the present invention.
Figure 8:
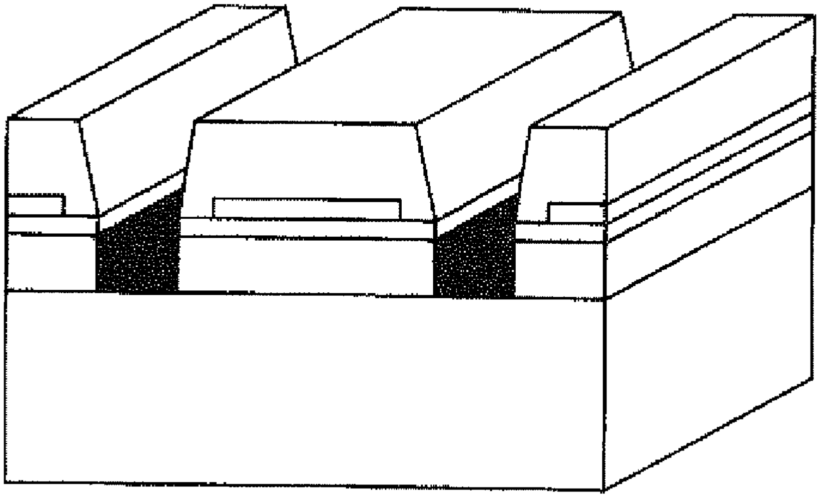
FIG. 8 is a schematic perspective view that shows still another process of the method for manufacturing a display device in accordance with first embodiment of the present invention.

(7) Next, a YAG laser beam 24 having a virtually linear shape is intermittently applied to the black matrix 19 that extends in the first direction from above the phosphor layer 3 so that the phosphor layer 3 is patterned (FIG. 7). Additionally, the wavelength of the YAG laser 24 has a wavelength that is longer than the wavelength corresponding to a band gap relative to the protective layer 18 and the phosphor layer 3 that are virtually optically transparent, so that it is not absorbed so much by the protective layer 18 and the phosphor layer 3, but absorbed by the black matrix 19 located beneath these layers; thus, together with the surface layer portion of the black matrix 19, the protective layer 18 and the phosphor layer 3 are removed (FIG. 8).

(8) Next, a back electrode 4 is formed on the phosphor layer 3 by a sputtering method. As the material for the back electrode 4, Pt is used, and the back electrode 4 is formed in a manner so as to be located between adjacent lines of the black matrix 19 and to extend virtually in parallel therewith, with predetermined intervals between one another, relative to the matrix lines of the black matrix 19 that extend in the second direction. As a result, the transparent electrode 2 and the back electrode 4 are made orthogonal to each other on the colored patterns of the color filter 17, and also made face to face with each other with the phosphor layer 3 interposed therebetween.

(9) Next, an insulating protective layer 11 is formed on the phosphor layer 3 and the back electrode 4.

By using the above-mentioned processes, a display device of the present embodiment is obtained.

Figure 9:
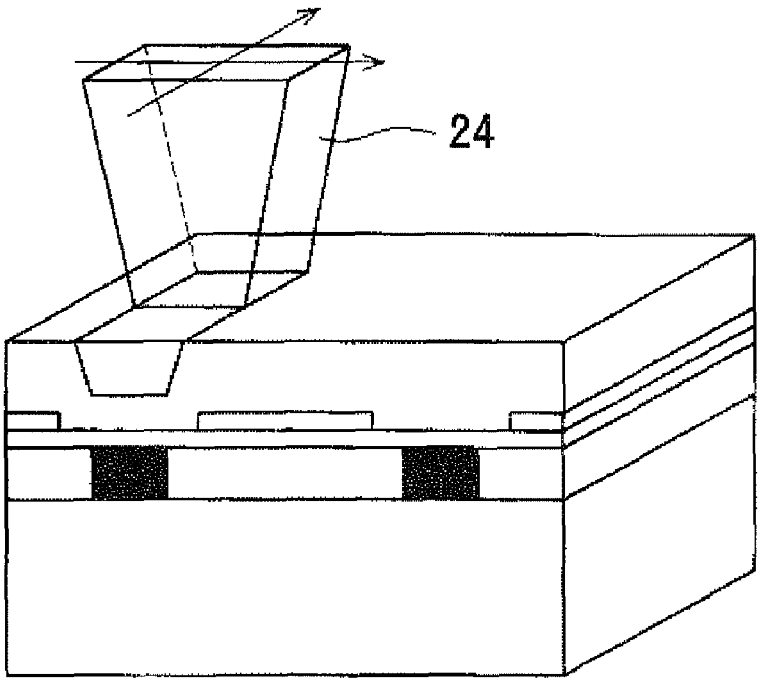
FIG. 9 is a schematic perspective view that shows the other process of the method for manufacturing a display device in accordance with first embodiment of the present invention.

Additionally, the spot shape of the laser 24 may be formed into a virtually dot shape. In this case, the patterning process of the phosphor layer 3 can be carried out by scanning the laser spot in the first direction as well as in the second direction (FIG. 9).

Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern.

<Effects>

In the display device in accordance with first embodiment, by removing the phosphor layer 3 located in an interpixel region between adjacent pixels over the same plane of the phosphor layer 3, a non-pixel region 3*b* having a higher resistance than that of the phosphor layer 3 of the pixel region 3*a* is formed. With this arrangement, even with a display device using a low resistance phosphor layer 3 that exhibits electroluminescent light emission, it is possible to greatly reduce crosstalk at the time of a displaying operation, and consequently to improve the display quality.

Second Embodiment

<Schematic Structure of Display Device>

Figure 10:
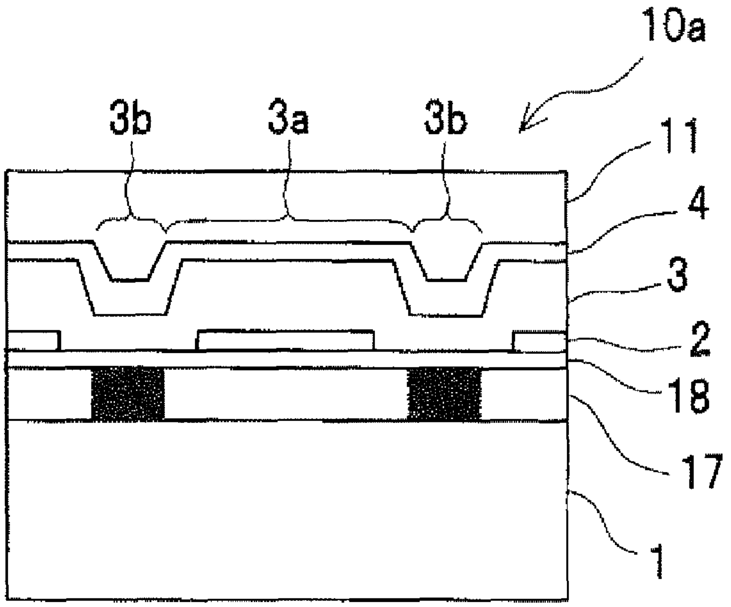
FIG. 10 is a schematic cross-sectional view that shows a structure of a display device in accordance with second embodiment of the present invention.

FIG. 10 is a schematic perspective view that shows a structure of a display device 10*a* in accordance with second embodiment of the present invention. This display 10*a* is different from the display device of first embodiment in that, in the interpixel region between the adjacent pixels, only an upper layer portion of the phosphor layer 3 is removed so that the respective pixel regions 3*a* are divided from each other. The regions from which the upper layer portions of the phosphor layer 3 have been removed are allowed to have a relatively thinner film thickness of the phosphor layer 3 in comparison with those peripheral regions without being removed portions, and consequently to have a relatively higher resistance in the direction in parallel with the light-emitting surface.

<Manufacturing Method>

The following description will discuss one example of a method for manufacturing the display device 10*a* in accordance with second embodiment. FIGS. 11 to 14 are schematic perspective views that show the respective processes of the manufacturing method of the present embodiment.

Figure 11:
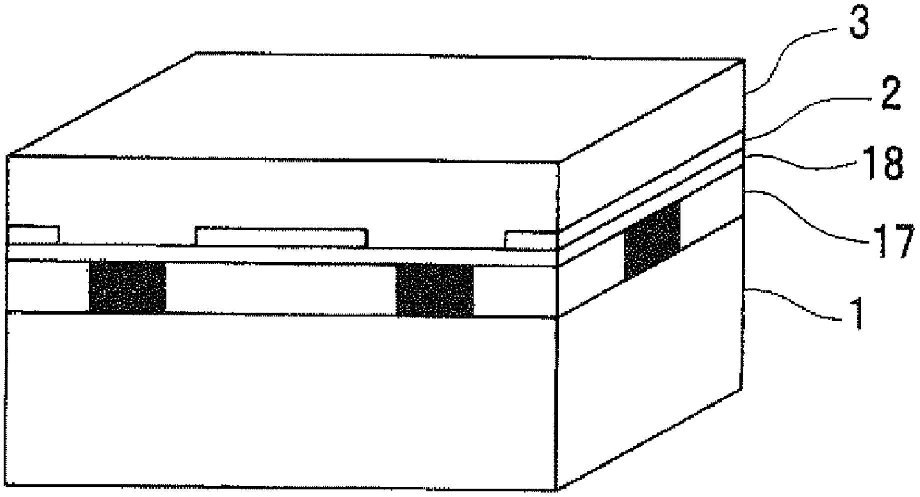
FIG. 11 is a schematic perspective view that shows one process of a method for manufacturing a display device in accordance with second embodiment of the present invention.

(1) A phosphor layer 3 is formed on a glass substrate 1 in a solid state in the same manner as in the method for manufacturing the display device in accordance with the aforementioned first embodiment (FIG. 11).

Figure 12:
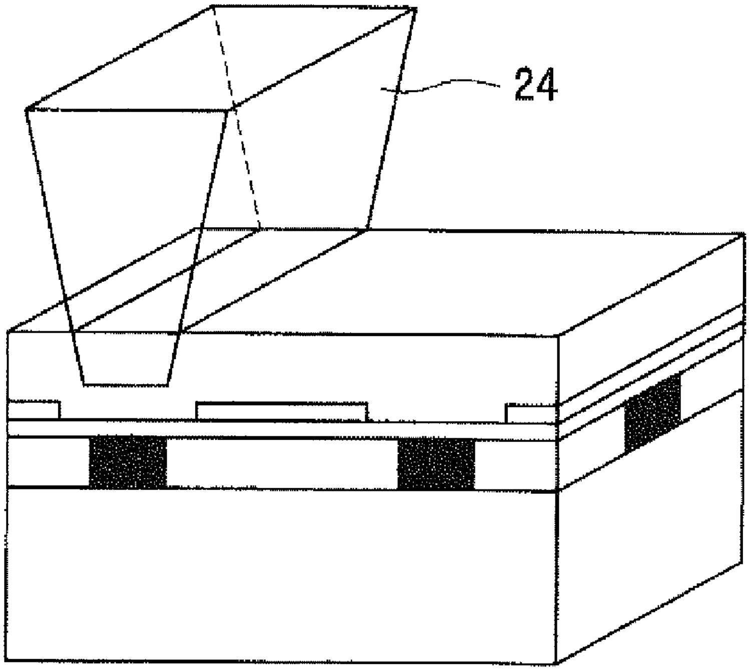
FIG. 12 is a schematic perspective view that shows another process of the method for manufacturing a display device in accordance with second embodiment of the present invention.
Figure 13:
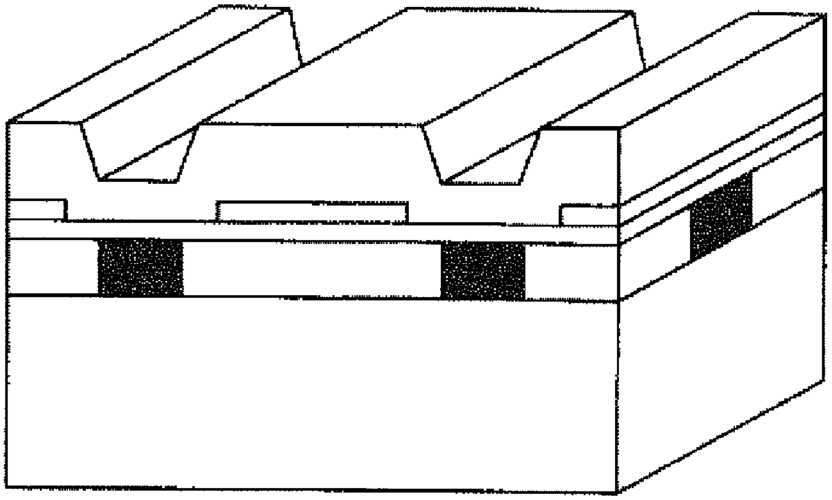
FIG. 13 is a schematic perspective view that shows still another process of the method for manufacturing a display device in accordance with second embodiment of the present invention.

(2) Next, a virtually linear excimer laser 24 is applied to an area that is virtually in parallel with the stripe-shaped transparent electrode 2 and located between adjacent transparent electrodes 2 from above the phosphor layer 3 so that the phosphor layer 3 is patterned (FIG. 12). The excimer laser 24 generates light having a comparatively short wavelength in the ultraviolet-ray range. In this wavelength, since the laser energy is absorbed by the phosphor layer 3 that is virtually transparent, only the portion irradiated with the laser 24 can be selectively heated locally so that the upper layer portion of the phosphor layer 3 is removed (FIG. 13).

(3) Next, in the same manner as in the manufacturing method for the display device of the aforementioned first embodiment, a back electrode 4 and a protective layer 11 are formed on the phosphor layer 3. The back electrode 4 and the transparent electrode 2 are made orthogonal to each other on the colored patterns of the color filter 17, and also made face to face with each other with the phosphor layer 3 interposed therebetween.

By using the above-mentioned processes, the display device 10*a* of the present embodiment is obtained.

Figure 14:
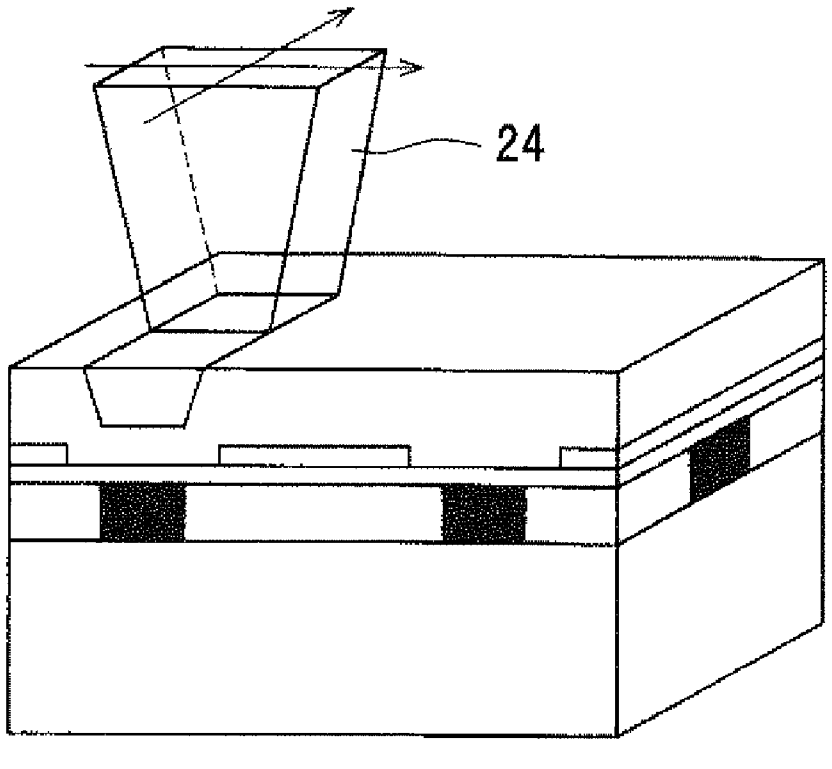
FIG. 14 is a schematic perspective view that shows the other process of the method for manufacturing a display device in accordance with second embodiment of the present invention.

Additionally, the spot shape of the laser 24 may be formed into a virtually dot shape. In this case, the patterning process of the phosphor layer 3 can be carried out by scanning the laser spot 24 in the first direction as well as in the second direction (FIG. 14).

Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern.

<Effects>

In the display device 10*a* of the present embodiment, by removing the phosphor layer 3 located in an interpixel region between adjacent pixels over the same plane of the phosphor layer 3, an area that makes the phosphor layer 3 disconnected is formed so that a non-pixel region 3*b* having a higher resistance than that of the phosphor layer 3 of the pixel region 3*a* is formed. With this arrangement, even with a display device using a low resistance phosphor layer that exhibits electroluminescent light emission, it is possible to greatly reduce crosstalk at the time of a displaying operation, and consequently to improve the display quality.

Third Embodiment

<Schematic Structure of Display Device>

Figure 15:
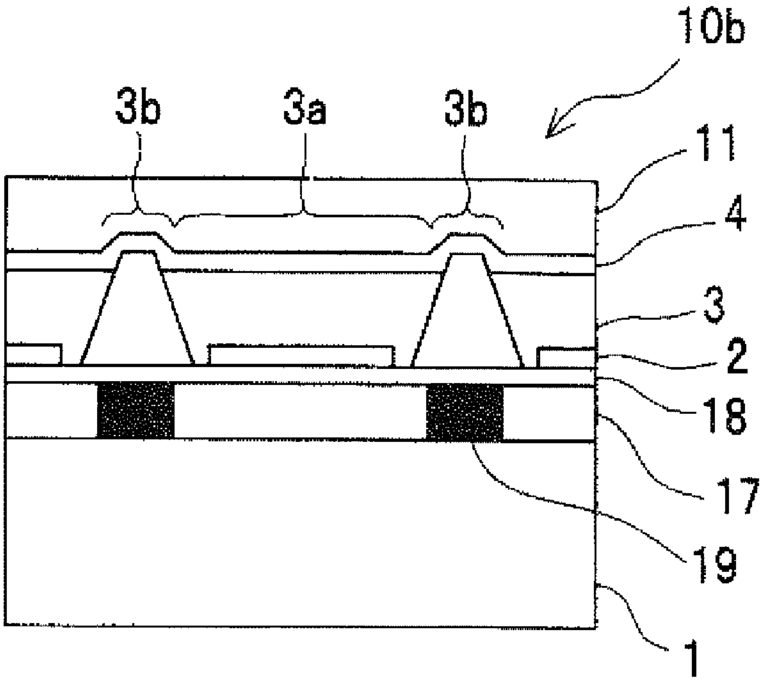
FIG. 15 is a schematic cross-sectional view that shows a structure of a display device in accordance with third embodiment of the present invention.

FIG. 15 is a schematic cross-sectional view that shows a structure of a display device 10*b* in accordance with third embodiment. This display 10*b* is different from the display device of first embodiment in that, in the interpixel region between the adjacent pixels 3*a*, a barrier plate 26 is formed as a non-pixel region 3*b* so that the respective pixel regions 3*a* are divided within the phosphor layer 3.

As the barrier plate 26, a material having higher resistance in comparison with the phosphor layer 3 can be used. The barrier plate 26 may be formed by using, for example, an organic material, an inorganic material and the like. Examples of the organic material include polyimide resin, acrylic resin, epoxy resin and urethane resin. Moreover, examples of the inorganic material include $SiO_2$, SiNx, alumina and the like, or a composite structure, such as a laminated structure and a mixed structure (for example, a binder in which an inorganic filler is dispersed) of these materials, may be used. The shape of the barrier plate 26 is not particularly limited, but the height of the barrier plate 26 is preferably set to about 0.5 to 1.5 times the film thickness of the phosphor layer 3. Moreover, the width of the barrier plate 26 is preferably set to 0.5 to 1.5 times the interval between the adjacent transparent electrodes.

<Manufacturing Method>

The following description will discuss one example of a method for manufacturing a display device 10*b* in accordance with third embodiment. FIGS. 16 to 19 are schematic perspective views that show the respective processes of the manufacturing method of the present example. Additionally, with respect to the phosphor layers made of the aforementioned other materials, the same manufacturing method may also be utilized.

Figure 16:
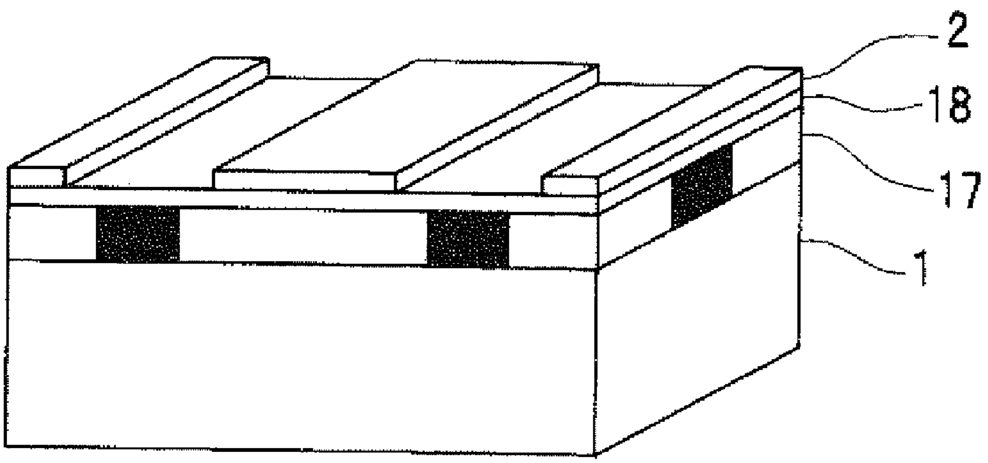
FIG. 16 is a schematic perspective view that shows one process of a method for manufacturing a display device in accordance with third embodiment of the present invention.

(1) In the same manner as in the method for manufacturing the display device of the aforementioned first embodiment, a color filter 17 is formed on a glass substrate 1, and a first protective layer 18 is formed thereon. Moreover, a transparent electrode 2 is formed on the first protective layer 18. The transparent electrode 2 is formed so as to be located between adjacent lines of the black matrix 19 and to extend virtually in parallel therewith, with predetermined intervals between one another, relative to the matrix lines of the black matrix 19 that extend in the first direction (FIG. 16).

Figure 17:
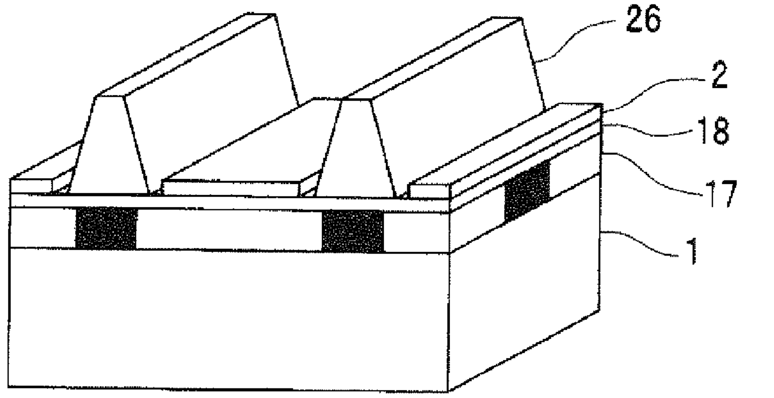
FIG. 17 is a schematic perspective view that shows another process of the method for manufacturing a display device in accordance with third embodiment of the present invention.

(2) Next, barrier plates 26 are formed on the first protective layer 18. The barrier plates 26 are formed in the following manner. First, a glass paste in which alumina powder is dispersed is formed into a stripe pattern by a screen printing process, with each stripe being located between the adjacent transparent electrodes 2 so as to extend in a first direction. Then, this is fired to obtain barrier plates 26 formed into a desired pattern (FIG. 17).

Figure 18:
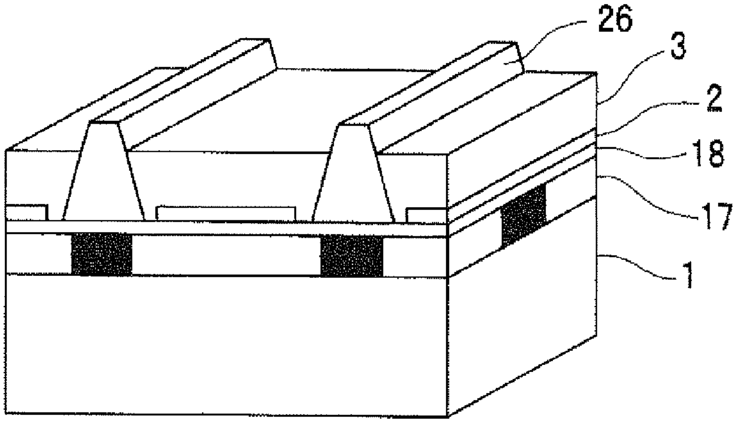
FIG. 18 is a schematic perspective view that shows still another process of the method for manufacturing a display device in accordance with third embodiment of the present invention.

(3) Next, in the same manner as in the method for manufacturing the display device relating to the aforementioned first embodiment, a phosphor layer 3 is formed on the transparent electrode 2. The barrier plates 26 are shield by using a metal mask (FIG. 18).

(4) Next, in the same manner as in the method for manufacturing the display device relating to the aforementioned first embodiment, a back electrode 4 and a second protective layer 11 are formed on the phosphor layer 3. The back electrode 4 is made orthogonal to the transparent electrode 2 on the colored patterns of the color filter 17, and also made face to face therewith, with the phosphor layer 3 interposed therebetween.

By using the above-mentioned processes, a display device 10*b* of the present embodiment is obtained.

Figure 19:
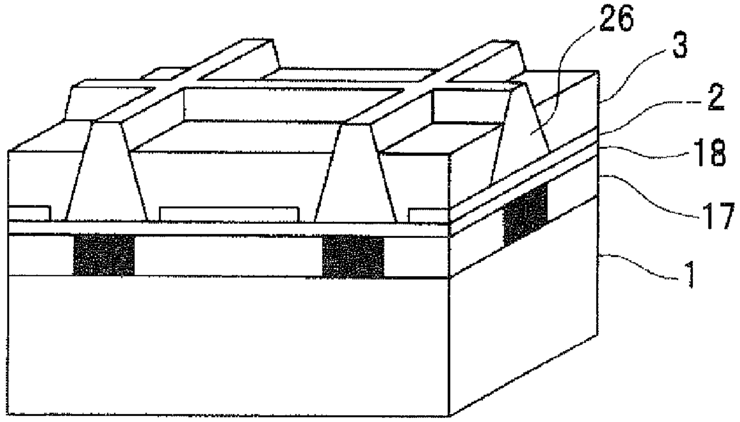
FIG. 19 is a schematic perspective view that shows the other process of the method for manufacturing a display device in accordance with third embodiment of the present invention.

Additionally, the pattern shape of the barrier plates 26 may be formed into a virtually lattice shape. In this case, each of the barrier plates 26 located in a manner so as to extend in the second direction is positioned between the adjacent back electrodes 4 (FIG. 19).

Moreover, the method for forming the barrier plates 26 is not intended to be limited by the screen printing method, and other methods, such as etching by the photolithography method, a sand-blasting method and an ink-jet method, may be used.

<Effects>

In the display device 10*b* of the present embodiment, each of the barrier plates 26, mainly made of an insulating resin, is formed in an interpixel region between adjacent pixels 3*a* over the same plane of the phosphor layer 3 so that a non-pixel region 3*b* having a higher resistance than that of the phosphor layer 3 of the pixel region 3*a* is formed. With this arrangement, even with a display device using a low resistance phosphor layer 3 that exhibits electroluminescent light emission, it is possible to greatly reduce crosstalk at the time of a displaying operation, and consequently to improve the display quality.

Fourth Embodiment

<Manufacturing Method>

Figure 20:
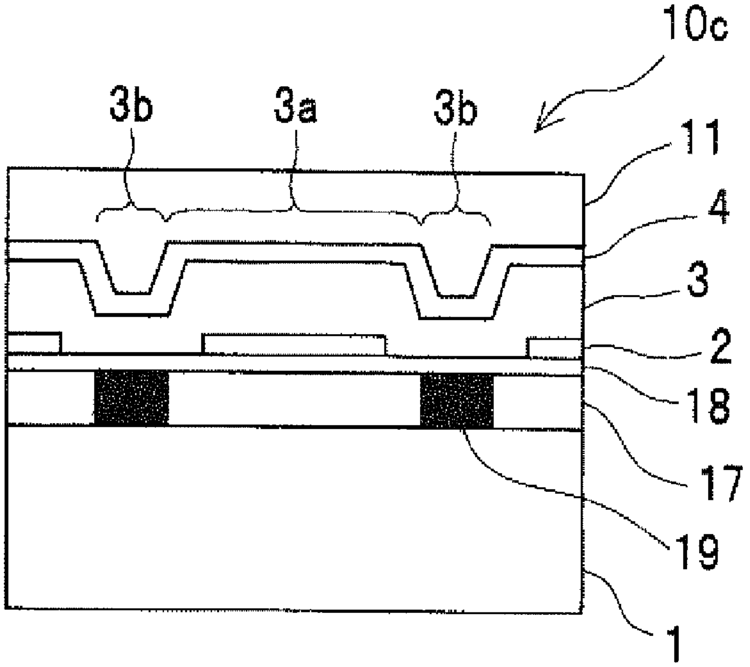
FIG. 20 is a schematic cross-sectional view that shows a structure of a display device in accordance with fourth embodiment of the present invention.

FIG. 20 is a schematic structural view that shows a display device 10*c* in accordance with fourth embodiment. This display 10*c*, which has the same structure and shape as those of the display device in accordance with second embodiment, is different therefrom in its manufacturing method. The following description will discuss one example of the method for manufacturing the display device 10*c* in accordance with fourth embodiment. FIGS. 21 to 24 are schematic perspective views that show the respective processes of the manufacturing method of the present example.

(1) In the same manner as in the method for manufacturing the display device of the aforementioned first embodiment, a transparent electrode 2 is formed on a glass substrate 1. The transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

Figure 21:
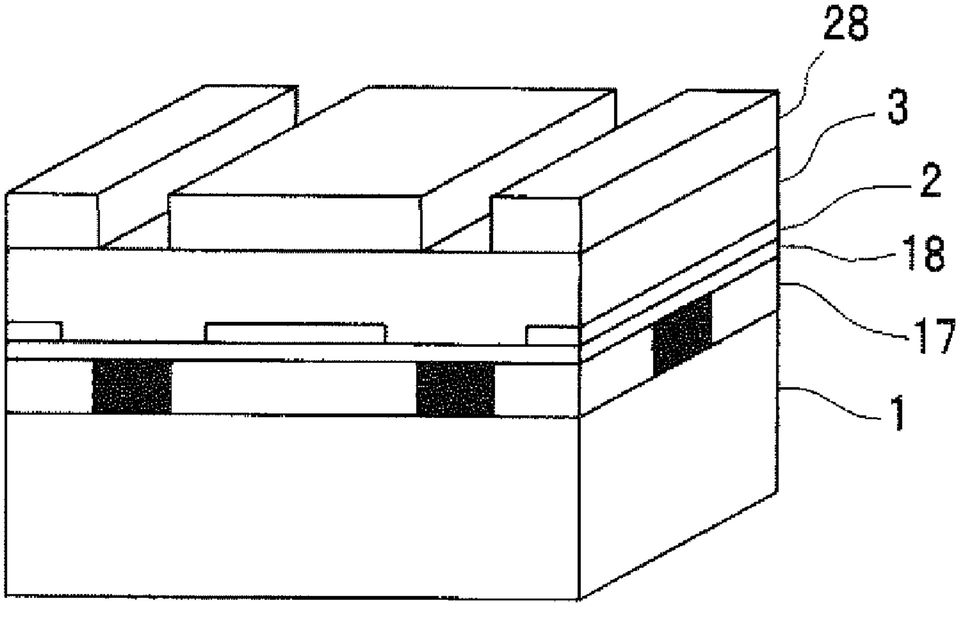
FIG. 21 is a schematic perspective view that shows one process of a method for manufacturing a display device in accordance with fourth embodiment of the present invention.

(2) Thereafter, in the same manner as in the method for manufacturing the display device relating to the aforementioned first embodiment, a phosphor layer 3 is formed thereon in a solid state, and this is then subjected to a photolithography method by using a photosensitive resist so that a mask pattern 28 is formed. This mask pattern 28 is designed so as to be located between adjacent transparent electrodes, and to extend in the first direction in parallel therewith, with openings formed therein with predetermined intervals from one another (FIG. 21).

Figure 22:
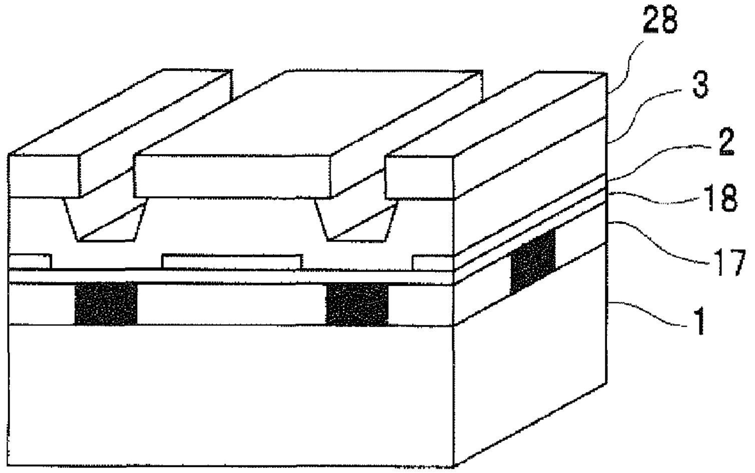
FIG. 22 is a schematic perspective view that shows another process of the method for manufacturing a display device in accordance with fourth embodiment of the present invention.

(3) Next, the exposed portions of the phosphor layer 3 are etched by using a dry etching method so as to have a desired thickness (FIG. 22).

Figure 23:
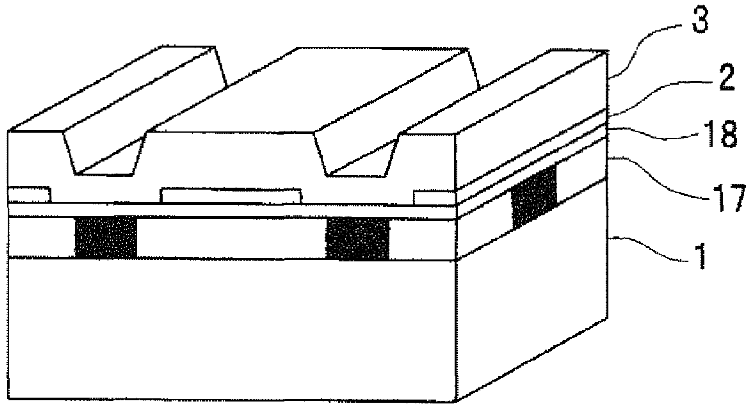
FIG. 23 is a schematic perspective view that shows still another process of the method for manufacturing a display device in accordance with fourth embodiment of the present invention.

(4) Next, the mask pattern 28 made of the photosensitive resist is removed (FIG. 23).

(5) Thereafter, in the same manner as in the method for manufacturing the display device relating to the aforementioned first embodiment, a back electrode 4 and a protective layer 11 are formed on the phosphor layer 3. The back electrode 4 and the transparent electrode 2 are made orthogonal to each other on the colored patterns of the color filter 17, and also made face to face with each other, with the phosphor layer 3 interposed therebetween.

The display device 10*c* of the present example is obtained by the above-mentioned processes.

Figure 24:
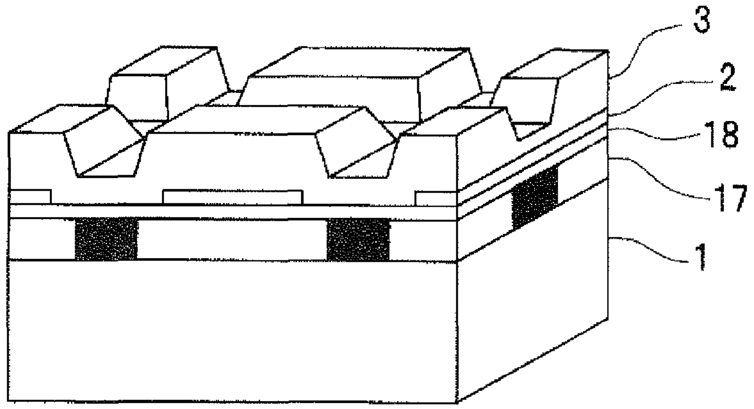
FIG. 24 is a schematic perspective view that shows the other process of the method for manufacturing a display device in accordance with fourth embodiment of the present invention.

Additionally, the pattern shape of the mask pattern 28 made of the photosensitive resist for use in the etching process is not limited by the above-mentioned stripe shape, but may be formed into a virtually lattice shape. In this case, the openings that are located to extend in the second direction, each being positioned between the adjacent back electrodes 4, are also placed in parallel with one another with predetermined intervals therebetween (FIG. 24).

Moreover, the etching method is not intended to be limited by the dry etching and another method, such as a wet-etching method and a sand-blasting method, may be used.

Figure 25:
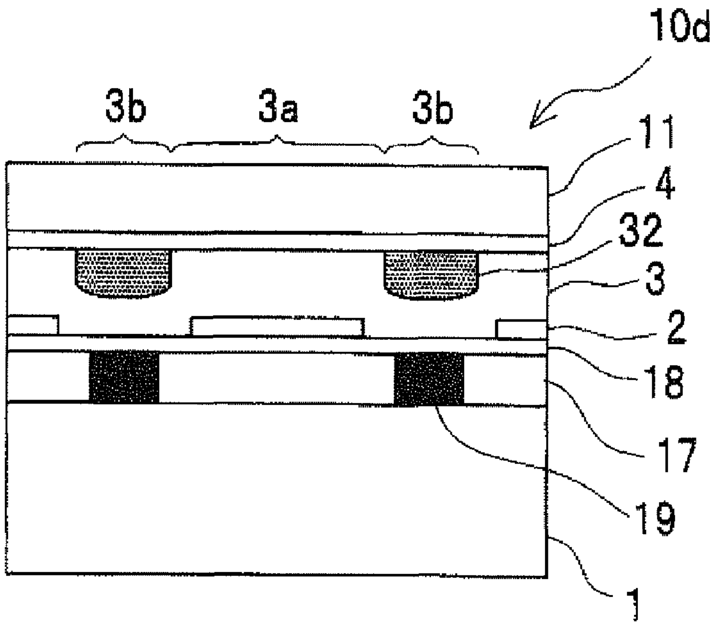
FIG. 25 is a schematic cross-sectional view that shows a structure of a modified example of a display device in accordance with fourth embodiment of the present invention.

Furthermore, FIG. 25 shows a display device 10*d* that is a modified example of fourth embodiment. This display device 10*d* differs from the display device 10*c* of fourth embodiment in that the etching process is not carried out to such an extent as to remove at least one portion of the phosphor layer 3. In the display device 10*d* of this modified example, during a wet etching process, the etching liquid that has permeated into the phosphor layer 3 to be dispersed therein forms a high resistance region 32 on one portion of the interpixel region (non-pixel region) 3*b* between the adjacent pixel regions 3*a* inside the phosphor layer 3.

<Effects>

In the display device 10*c* of the present fourth embodiment, an area having a higher resistance than that of the pixel region 3*a* is formed in an interpixel region 3*b* between the adjacent pixels over the same plane of the phosphor layer 3. Thus, even with a display device using a low resistance phosphor layer 3 that exhibits electroluminescent light emission, it is possible to greatly reduce crosstalk at the time of a displaying operation, and consequently to improve the display quality.

Fifth Embodiment

<Schematic Structure of Display Device>

Figure 26:
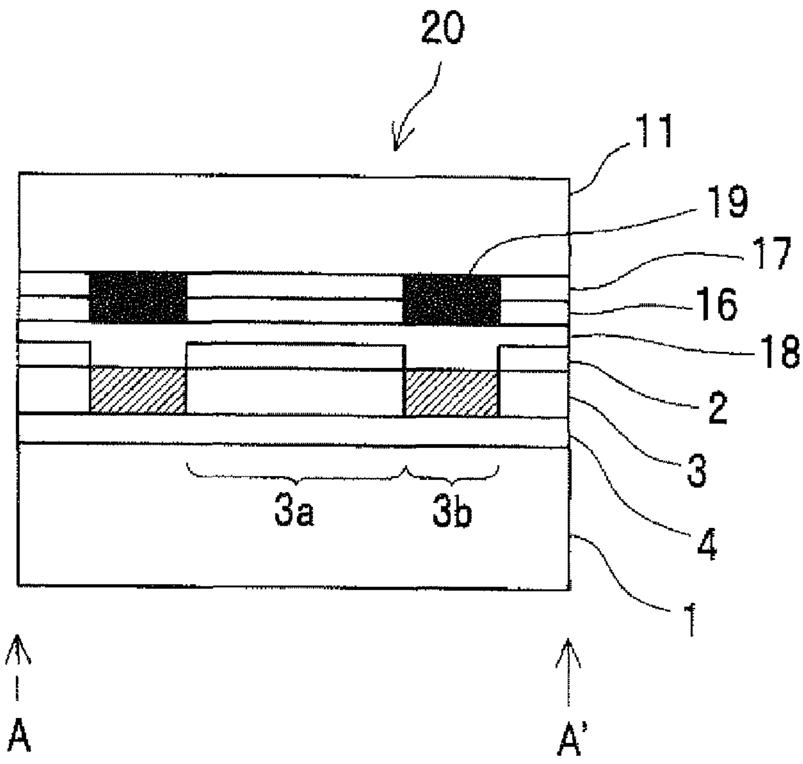
FIG. 26 is a schematic cross-sectional view that shows a structure of a display device in accordance with fifth embodiment of the present invention.

FIG. 26 is a schematic cross-sectional view that shows a cross-sectional structure of a display device 20 in accordance with fifth embodiment of the present invention. In this display device 20, a phosphor layer 3 containing an illuminant is formed between a transparent electrode 2 serving as a first electrode and a back electrode 4 serving as a second electrode. A substrate 1, which supports these electrodes, is formed adjacent to the back electrode 4. The transparent electrode 2 and the back electrode 4 are electrically connected to each other with a power supply interposed therebetween. When power is supplied from the power supply, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2, and is taken out from the display device 20. In the display device 20 of the present embodiment, a DC power supply is used as the power supply. As shown in FIG. 26, the color filter 17 is provided on the transparent electrode 2. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB.

On the other hand, not limited to the above-mentioned structure, for example, another structure may be used in which a plurality of phosphor layers 3 are formed, both of the first and second electrode are prepared as the transparent electrodes, the back electrode 4 is prepared as a black-colored electrode, a structure for sealing the entire portion or one portion of the display device 20 by the protective layer 11 is further provided, or a color-converting structure (color-conversion layer 16) that converts the color of light emission from the phosphor layer 3 is further prepared in front of the color filter 17.

<Manufacturing Method>

The following description will discuss one example of a method for manufacturing a display device 20 in accordance with fifth embodiment.

(1) First, a glass substrate is prepared as a substrate 1.

(2) Next, a back electrode 4 is formed on the substrate 1 by using a sputtering method. In this case, Pt is used as the back electrode 4, and the back electrode 4 is formed as a plurality of linear patterns that extend in a first direction in parallel with the surface of the glass substrate 1, in parallel with one another, with predetermined intervals being formed therebetween.

(3) Next, a phosphor layer 3 is formed in a solid state from the glass substrate 1 to the back electrode 4, in the same manner as in first embodiment.

Figure 27:
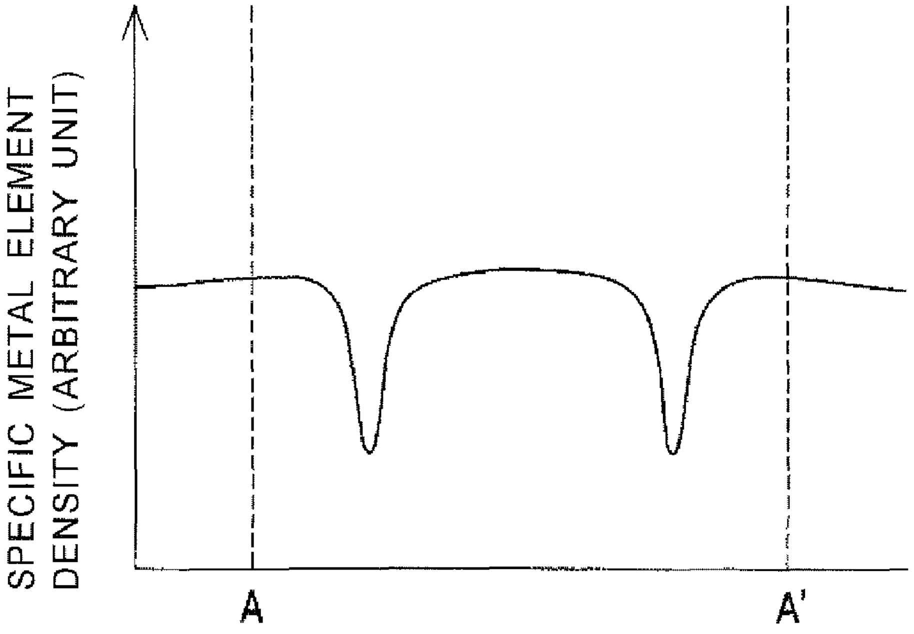
FIG. 27 is a graph that shows a change in a specific metal element concentration taken along line A-A of a phosphor layer 3 of FIG. 26.

(4) Next, after a dopant material has been vapor deposited by using a mask on a region 3*a* corresponding to pixels on the phosphor layer 3, the dopant is heated and diffused by using an annealing process. Thus, the phosphor layer 3 forms a dopant density distribution including the pixel region 3*a* with a high density and the interpixel regions 3*b* with a low density, within the in-plane thereof. FIG. 27 shows a state of the dopant density distribution at this time. A specific dopant material, for example, Zn or the like forms a factor for reducing the resistance of the phosphor layer. The interpixel regions 3*b*, which have a lower dopant density than that of the pixel region 3*a*, are allowed to have resistance higher than that of the pixel region 3*a*. Simultaneously, the host substance within the phosphor layer 3 is progressively crystallized to also exert an effect for reducing the density of the non-light emission recombination center.

(5) Next, a transparent electrode 2 is formed on the phosphor layer 3 by a sputtering method. As the material for the transparent electrode 2, ITO is used, and the transparent electrode 2 is formed as a linear pattern having a plurality of lines that are located in parallel with the surface of the glass substrate 1 and extend in a second direction virtually orthogonal to the aforementioned first direction, in parallel with one another with predetermined intervals between one another.

(6) Next, after film-forming SiN as a protective layer from the phosphor layer 3 to the transparent electrode 2, a black matrix 19 is formed by a photolithography method by using a resin material containing carbon black. The black matrix 19 is disposed virtually in a lattice shape by using a plurality of linear patterns that extend in the first direction in parallel with the surface of the glass substrate, between gaps of the back electrodes 4, and a plurality of linear patterns that extend in the second direction between gaps of the adjacent transparent electrodes 2.

(7) Next, by using color resists, colored patterns are formed between adjacent matrix lines of the black matrix 19 by a photolithography method. These processes are repeatedly carried out for the respective colors of R, G and B so that a color filter 17 is formed.

(8) Next, an insulating protective layer 11 is formed on the color filter 17 by using an epoxy resin.

By using the above-mentioned processes, a top-emission-type display device 20 of the present embodiment is obtained.

Figure 28:
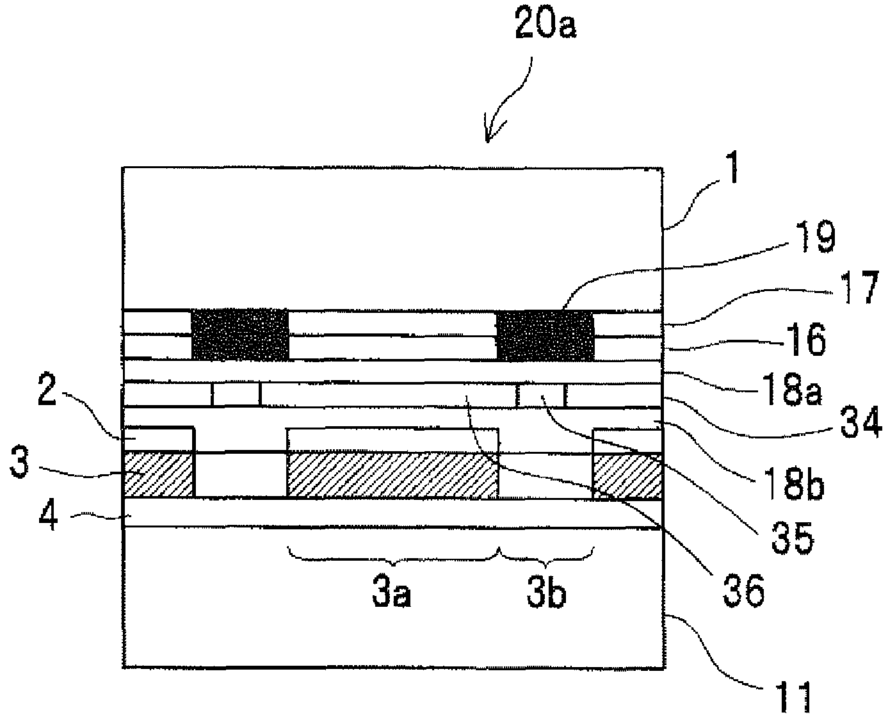
FIG. 28 is a schematic cross-sectional view that shows a structure of a modified example of a display device in accordance with fifth embodiment of the present invention.

Additionally, as the annealing means, an entire heating process by using an electric furnace or the like may be carried out, or a local heating process by using laser irradiation may be carried out. Moreover, as shown in FIG. 28, the color filter 17, formed on the glass substrate 1, and a color conversion layer 16 are bonded to each other with an adhesive layer 34 interposed therebetween so that a top-emission-type display device 20*a* of another example may be manufactured.

<Effects>

In the display device 20 in accordance with fifth embodiment, over the same plane of the phosphor layer 3, the phosphor layer 3*b* in the interpixel region between the adjacent pixel regions 3*a* is made to have higher resistance than that of the phosphor layer 3*a* in the pixel region so that even with a display device using a low resistance phosphor layer that exhibits electroluminescent light emission, it is possible to greatly reduce crosstalk at the time of a displaying operation, and consequently to improve the display quality.

Sixth Embodiment

<Schematic Structure of Display Device>

Figure 29:
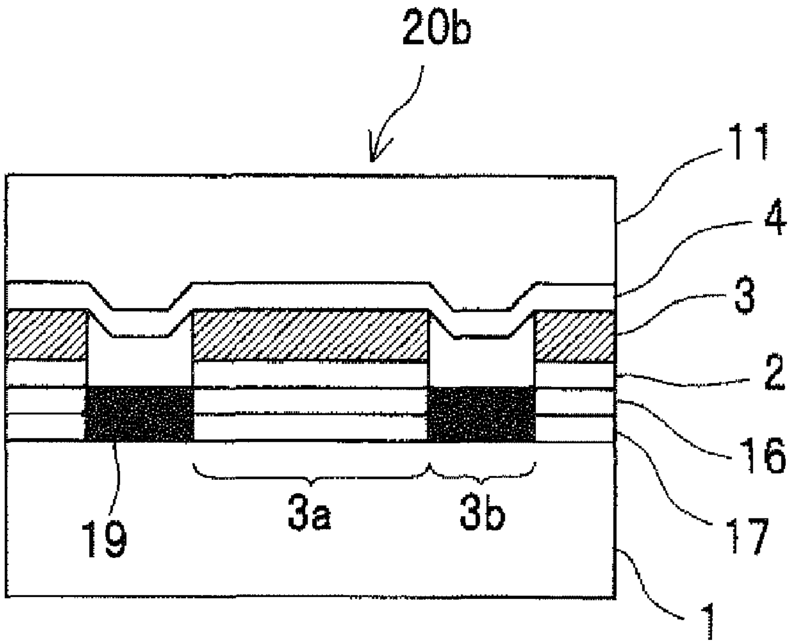
FIG. 29 is a schematic cross-sectional view that shows a structure of a display device in accordance with sixth embodiment of the present invention.

FIG. 29 is a schematic cross-sectional view that shows a structure of a display device 20*b* in accordance with sixth embodiment. This display 20*b* has a bottom-emission-type structure in which light emission is taken out from the transparent substrate 1 side. In this structure, virtually the same members as those of the first embodiment may be used, except that the color filter 17 and the color-conversion layer 16 are disposed at lower layers of the phosphor layer 3.

<Manufacturing Method>

The following description will discuss one example of a method for manufacturing the display device 20*b* in accordance with sixth embodiment.

(1) First, a glass substrate is prepared as a transparent substrate 1.

(2) On the glass substrate 1, a black matrix 19 is formed by using a resin material containing carbon black through a photolithography method. The black matrix 19 is disposed virtually in a lattice shape by using a plurality of linear patterns that extend in a first direction in parallel with the surface of the glass substrate 1 with predetermined intervals and a plurality of linear patterns that extend in a direction orthogonal to the first direction with predetermined intervals.

(3) Next, by using color resists, colored patterns are formed between adjacent matrix lines of the black matrix 19 by a photolithography method. These processes are repeatedly carried out for each of the colors of R, G and B so that a color filter 17 is formed.

(4) Next, a protective layer 16 is formed on each of the colored patterns of the color filter 17, and a transparent electrode 2 is formed on the protective layer 16 by a sputtering method. As the material for the transparent electrode 2, ITO is used, and the transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

(5) Next, a phosphor layer 3 is formed in a solid state from the color-conversion layer 16 to the transparent electrode 2 in the same manner as in first embodiment. Moreover, by ion-injecting a dopant material to the region 3*a* corresponding to pixels on the phosphor layer 3, it is possible to form a dopant density distribution including the pixel region 3*a* with a high density and the interpixel regions 3*b* with a low density, within the in-plane of the phosphor layer 3.

(6) Next, a back electrode 4 is formed on the phosphor layer 3 by a sputtering method. As the material for the back electrode 4, Pt is used, and the back electrode 4 is formed in a manner so as to be located between adjacent lines of the black matrix 19 and to extend virtually in parallel therewith, with predetermined intervals between one another, relative to the matrix lines of the black matrix 19 that extend in the second direction. As a result, the transparent electrode 2 and the back electrode 4 are made orthogonal to each other on the colored patterns of the color filter 17, and also made face to face with each other with the phosphor layer 3 interposed therebetween.

(7) Next, an insulating protective layer 11 is formed on the phosphor layer 3 and the back electrode 4 by using an epoxy resin.

By using the above-mentioned processes, a bottom-emission-type display device 20*b* of the present embodiment is obtained.

In this display device 20*b*, each pixel includes a light-emitting element, and a plurality of pixels are disposed two-dimensionally to form this structure. In accordance with this display device 20*b*, it is possible to greatly reduce crosstalk at the time of a displaying operation, and consequently to improve the display quality in the same manner as in first embodiment.

Seventh Embodiment

<Schematic Structure of Display Device>

Figure 30:
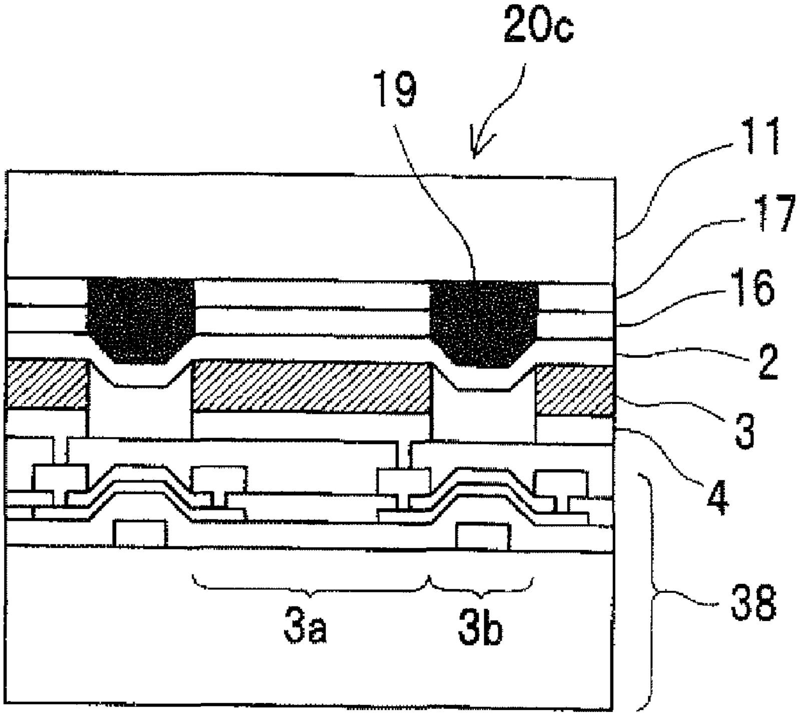
FIG. 30 is a schematic cross-sectional view that shows a structure of a display device in accordance with seventh embodiment of the present invention.

FIG. 30 is a cross-sectional view that shows a schematic structure of a display device 20*c* in accordance with seventh embodiment. This display device 20*c* is an active-driving type display device that uses a substrate 38 (hereinafter, referred to as "TFT substrate") in which a thin-film transistor for use in switching is installed in each of the pixels. This display device 20*c* is formed by successively stacking a back electrode 4, a phosphor layer 3 in a solid state and a transparent electrode 2 in a solid state, each installed in each pixel, on the TFT substrate 38. This has a top-emission-type structure in which light emission is taken out from the transparent electrode 2 side. In this structure, virtually the same members as those of the first embodiment and the same manufacturing method as that of the first embodiment may be used, except that the TFT substrate 38 is used.

In the same manner as in the display device of the first embodiment, the display device 20*c* makes it possible to greatly reduce crosstalk at the time of a displaying operation, and consequently to improve the display quality.

Eighth Embodiment

<Schematic Structure of Display Device>

Figure 31:
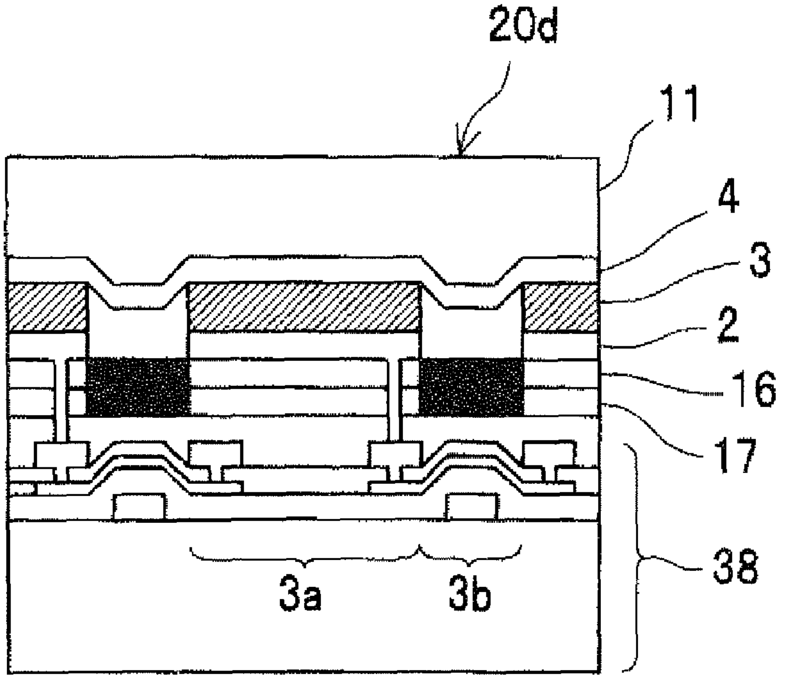
FIG. 31 is a schematic cross-sectional view that shows a structure of a display device in accordance with eighth embodiment of the present invention.

FIG. 31 is a cross-sectional view that shows a schematic structure of a display device 20*d* in accordance with eighth embodiment. This display device 20*d* has a bottom-emission type structure in which light emission is taken out from the TFT substrate 38 side. Since the color filter 17 and the color conversion layer 16 are disposed on the lower side of the phosphor layer 3, a dopant density distribution of the phosphor layer 3 is formed by using a manufacturing method in which no thermal stress is applied to the lower layer, in the same manner as in sixth embodiment. In this structure, virtually the same members as those of the seventh embodiment may be used, except for this density distribution forming process.

In the same manner as in the display device of the first embodiment, the display device 20*d* makes it possible to greatly reduce crosstalk at the time of a displaying operation, and consequently to improve the display quality.

Ninth Embodiment

<Schematic Structure of Display Device>

Figure 32:
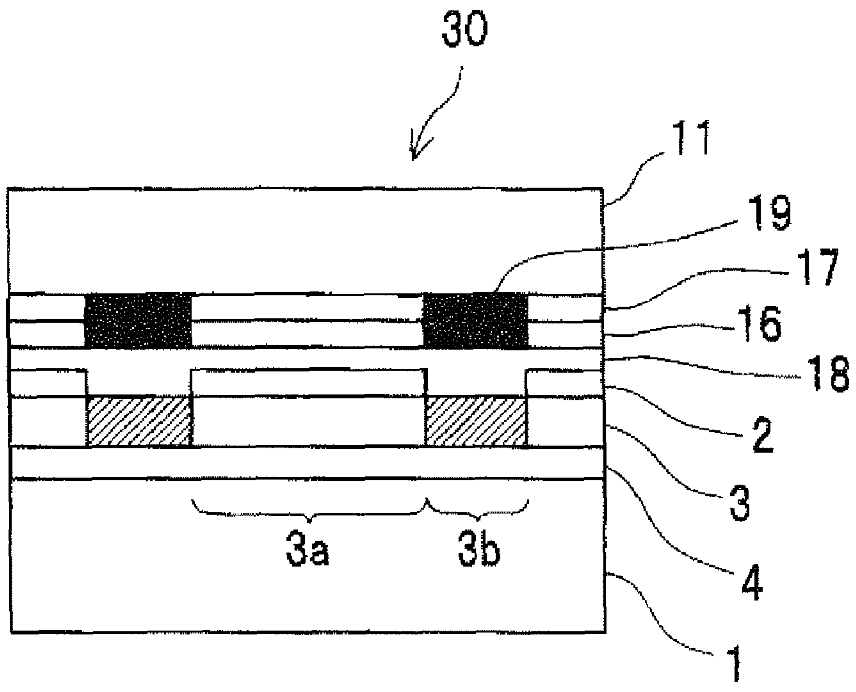
FIG. 32 is a schematic cross-sectional view that shows a structure of a display device in accordance with ninth embodiment of the present invention.

FIG. 32 is a schematic cross-sectional view that shows a cross-sectional structure of a display device 20 in accordance with fifth embodiment of the present invention. In this display device 30, a phosphor layer 3 containing an illuminant is formed between a transparent electrode 2 serving as a first electrode and a back electrode 4 serving as a second electrode. A substrate 1, which supports these electrodes, is formed adjacent to the back electrode 4. The transparent electrode 2 and the back electrode 4 are electrically connected to each other with a power supply interposed therebetween. When power is supplied from the power supply, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2, and is taken out from the display device 20. In the display device 30 according to the ninth embodiment, a DC power supply is used as the power supply. As shown in FIG. 32, the color conversion layer 16 and the color filter 17 are further provided on the transparent electrode 2. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB. Moreover, the color conversion layer 16 has a function for converting a light emission color from the phosphor layer 3 into a long wavelength light ray, and, for example, in a case where a blue-color light ray is emitted from the phosphor layer 3, the blue-color light ray is converted into a green-color light ray or a red-color light ray by the color conversion layer 16, and is taken out.

On the other hand, not limited to the above-mentioned structure, for example, another structure may be used in which a plurality of phosphor layers 3 are formed, both of the first and second electrode are prepared as the transparent electrodes, the back electrode 4 is prepared as a black-colored electrode, or a structure for sealing the entire portion or one portion of the display device 30 by the protective layer 11 is further provided. When the light emission from the phosphor layer 3 corresponds to a white-color light ray, a structure that eliminates the necessity of the color conversion layer 16 is also available.

<Manufacturing Method>

The following description will discuss one example of a method for manufacturing a display device 30 in accordance with ninth embodiment.

(1) First, a glass substrate is prepared as a substrate 1.

(2) Next, a back electrode 4 is formed on the substrate 1 by using a sputtering method. In this case, Pt is used as the back electrode 4, and the back electrode 4 is formed as a plurality of linear patterns that extend in a first direction in parallel with the surface of the glass substrate 1, in parallel with one another, with predetermined intervals being formed therebetween.

(3) Next, a phosphor layer 3 is formed in a solid state from the glass substrate 1 to the back electrode 4, in the same manner as in first embodiment.

(4) Next, by applying a laser annealing process only to the pixel region 3*a* corresponding to the pixels on the phosphor layer 3, a crystalline distribution pattern in which the pixel region 3*a* forms a crystalline phase while the interpixel regions 3*b* form amorphous phase is formed is formed within the in-plane of the phosphor layer 3.

(5) Next, a transparent electrode 2 is formed on the phosphor layer 3 by a sputtering method. As the material for the transparent electrode 2, ITO is used, and the transparent electrode 2 is formed as a linear pattern having a plurality of lines that are located in parallel with the surface of the glass substrate and extend in a second direction virtually orthogonal to the aforementioned first direction, in parallel with one another with predetermined intervals between one another.

(6) Next, after film-forming SiN as a protective layer 18 on the phosphor layer 3 or the transparent electrode 2, a black matrix 19 is formed by a photolithography method by using a resin material containing carbon black. The black matrix 19 is disposed virtually in a lattice shape by using a plurality of linear patterns that extend in the first direction in parallel with the surface of the glass substrate 1, between gaps of the back electrodes 4, and a plurality of linear patterns that extend in the second direction between gaps of the adjacent transparent electrodes 2.

(7) Next, after forming the cover conversion layer 16 by using an inkjet method, colored patterns are formed between adjacent matrix lines of the black matrix 19 by using color resists through a photolithography method. These processes are repeatedly carried out for the respective colors of R, G and B so that a color filter 17 is formed.

(8) Next, an insulating protective layer 11 is formed on the color filter 17 by using an epoxy resin.

By using the above-mentioned processes, a top-emission-type display device 30 of the present embodiment is obtained.

Figure 33:
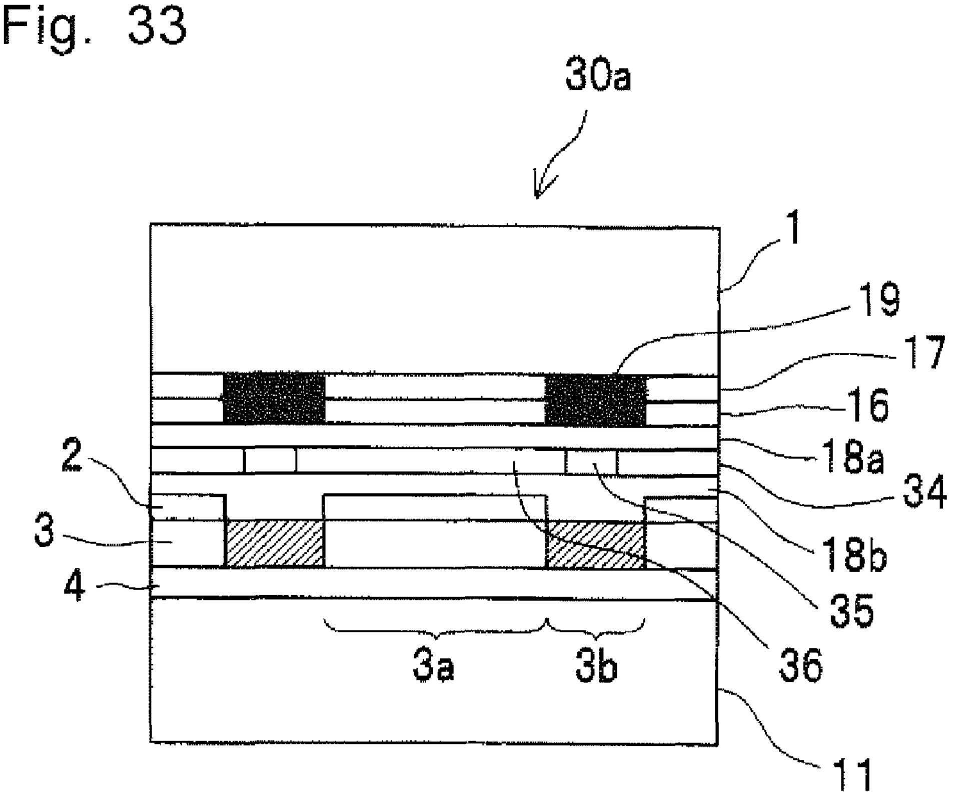
FIG. 33 is a schematic cross-sectional view that shows a structure of a modified example of a display device in accordance with ninth embodiment of the present invention.

Additionally, as shown in FIG. 33, the color filter 17, formed on the glass substrate 1, and a color conversion layer 16 are bonded to each other with an adhesive layer 34 interposed therebetween so that a top-emission-type display device 30*a* of another example may be manufactured. In this case, a protective layer 18*b* is formed on the transparent electrode 2, and a protective layer 18*a* is formed on the color conversion layer 16, and by forming an adhesive layer 34 on either one of the respective protective layers 18*a* and 18*b*, the protective layers may be bonded to each other. The adhesive layer 34 includes an adhesive 35 and a filler 36.

<Effects>

In the display device 30 in accordance with ninth embodiment, over the same plane of the phosphor layer 3, the pixel region 3*a* is formed into a crystalline phase, while the interpixel region 3*b* between the adjacent pixel regions is formed into an amorphous phase so that even with a display device using a low resistance phosphor layer that exhibits electroluminescent light emission, it is possible to greatly reduce crosstalk at the time of a displaying operation, and consequently to improve the display quality.

Tenth Embodiment

<Schematic Structure of Display Device>

Figure 34:
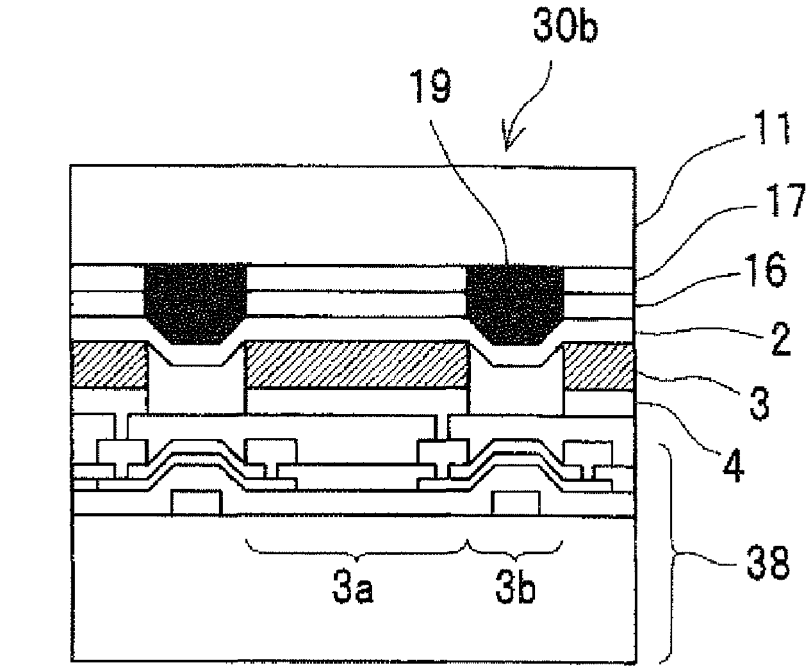
FIG. 34 is a schematic cross-sectional view that shows a structure of a display device in accordance with tenth embodiment of the present invention.

FIG. 34 is a cross-sectional view that shows a schematic structure of a display device 30*b* in accordance with tenth embodiment. This display device 30*b* has an active-driving type display device that uses a substrate 38 (hereinafter, referred to as "TFT substrate") in which a switching thin-film transistor is installed in each of the pixels. This display device 30*b* is formed by successively stacking a back electrode 4, a phosphor layer 3 in a solid state and a transparent electrode 2 in a solid state, each installed in each pixel, on the TFT substrate 38. This display device 30*b* has a top-emission-type structure in which light emission is taken out from the transparent electrode 2 side. In this structure, virtually the same members as those of the first embodiment and the same manufacturing method as that of the first embodiment may be used, except that the TFT substrate 38 is used.

In the same manner as in the display device of the first embodiment, the display device 30*b* makes it possible to greatly reduce crosstalk at the time of a displaying operation, and consequently to improve the display quality.

Eleventh Embodiment

<Schematic Structure of Display Device>

Figure 35:
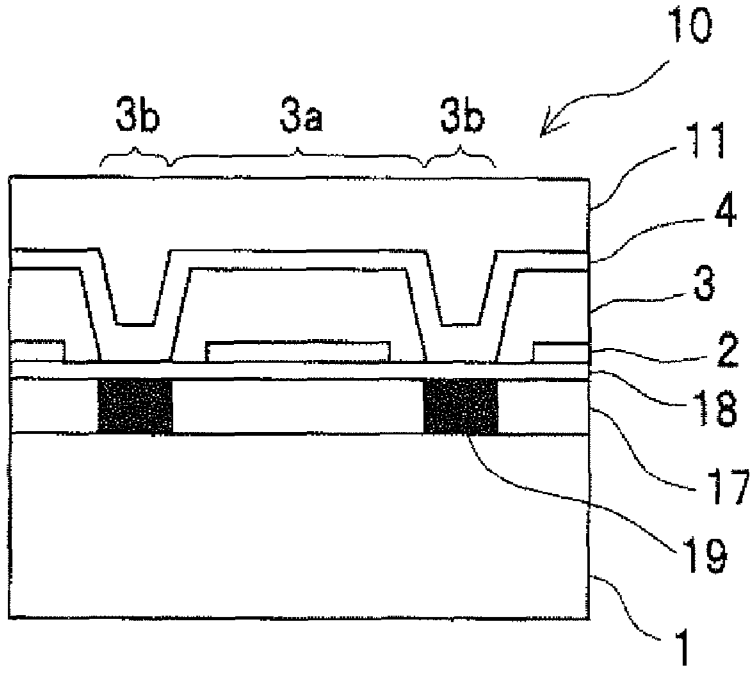
FIG. 35 is a schematic cross-sectional view that shows a structure of a display device in accordance with eleventh embodiment of the present invention.

FIG. 35 is a schematic cross-sectional view that shows a cross-sectional structure of a display device 10 in accordance with eleventh embodiment of the present invention. In this display device 10, a phosphor layer 3 containing an illuminant is formed between a transparent electrode 2 serving as a first electrode and a back electrode 4 serving as a second electrode. A transparent substrate 1, which supports these electrodes, is formed adjacent to the transparent electrode 2. The transparent electrode 2 and the back electrode 4 are electrically connected to each other with a power supply 5 interposed therebetween. When power is supplied from the power supply 5, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2 and the transparent substrate 1, and is taken out from the display device 10. In the present embodiment, a DC power supply is used as the power supply 5.

Figure 36:
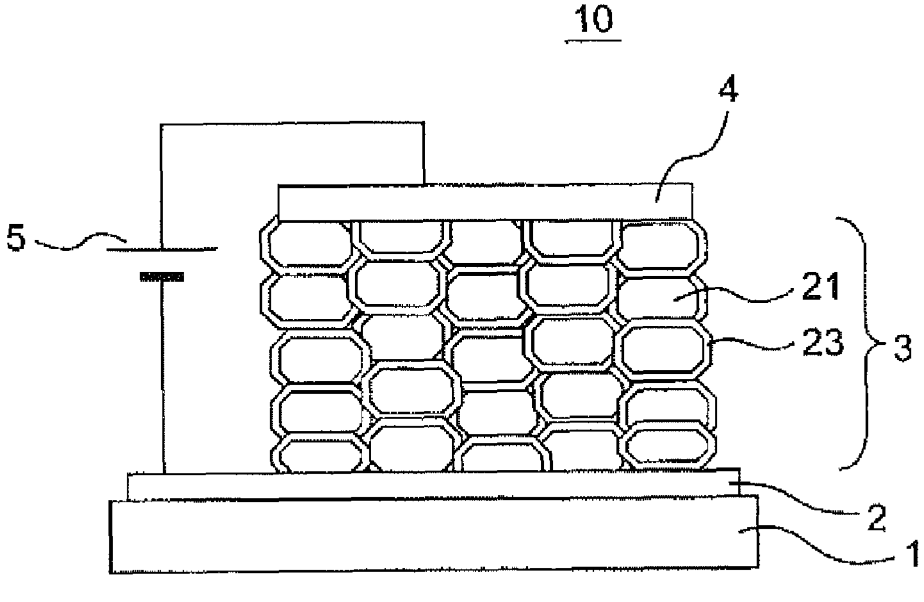
FIG. 36 is a cross-sectional view that shows a detailed structure of a phosphor layer of the display device shown in FIG. 35.
Figure 37:
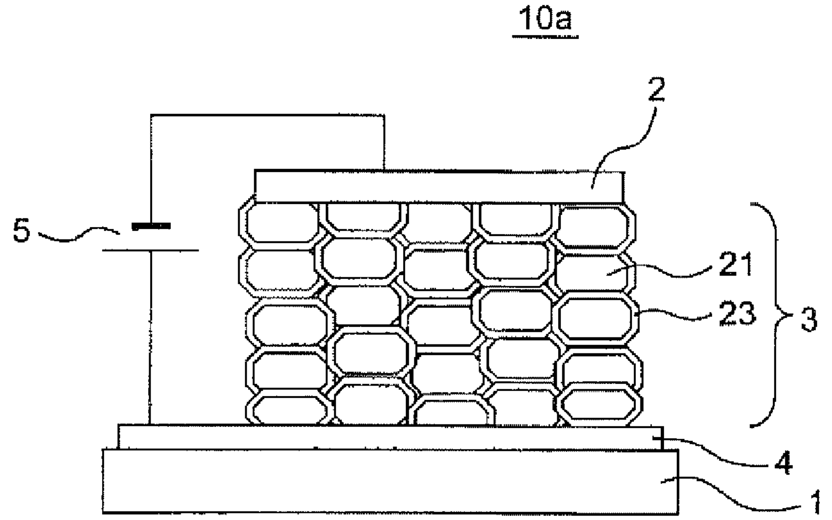
FIG. 37 is a cross-sectional view that shows a display device of another example.
Figure 38:
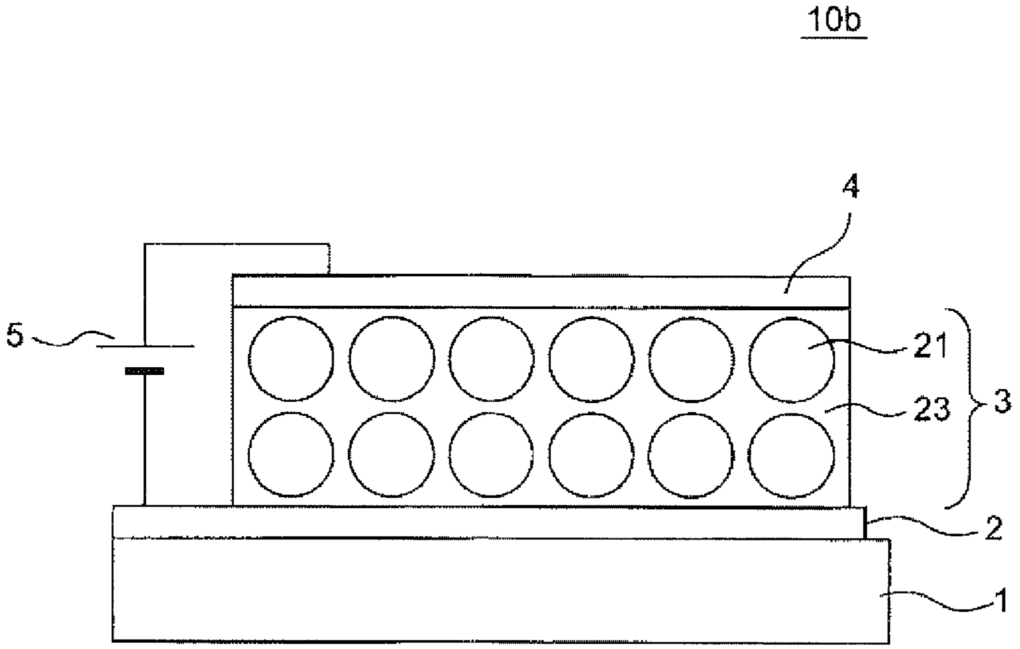
FIG. 38 is a cross-sectional view that shows a display device of still another example.

The display device 10 is characterized in that, as shown in FIG. 36, the phosphor layer 3 includes an aggregated body of n-type semiconductor particles 21 with a p-type semiconductor 23 being segregated between the particles. As shown in FIG. 36, the present embodiment exemplifies the structure in which the transparent electrode 2 is formed on the substrate 1; however, not limited by this structure, for example, as shown in a display device 10*a* of another example in FIG. 37, another structure may be used in which the back electrode 4 is formed on the substrate 1 with the phosphor layer 3 and the transparent electrode 2 being successively stacked thereon. Alternatively, a display device 10*b* of still another example in FIG. 38 is characterized in that the phosphor layer 3 includes n-type semiconductor particles 21 dispersed in a medium of a p-type semiconductor 23. In this manner, forming many interfaces between the n-type semiconductor particles and the p-type semiconductor, the injecting property of positive holes is improved so that the recombination type light emission between electrons and positive holes is effectively generated; thus, a display device capable of emitting light with high luminance at a low voltage can be achieved. Moreover, by providing a structure in which n-type semiconductor particles are electrically connected to the electrode through a p-type semiconductor, the light-emitting efficiency can be improved so that it becomes possible to provide a display device that can emit light at a low voltage with high luminance.

Moreover, in the display device 10, a plurality of pixel regions 3*a* capable of selectively emitting light are disposed two-dimensionally in the phosphor layer 3. The respective pixel regions 3*a* are selected by a combination of the transparent electrode 2 and the back electrode 4, and allowed to emit light. Moreover, the respective pixel regions 3*a* are also divided by non-pixel regions 3*b*. The non-pixel regions 3*b* are formed by discontinuous portions of the phosphor layer 3. The back electrode 4 is formed on one portion of the discontinuous portions within the interpixel regions in a manner so as to surround each pixel region 3*a*. Moreover, the display device 10 is further provided with a color filter 17 between the transparent electrode 2 and the transparent substrate 1. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB.

Additionally, not limited to the above-mentioned structure, for example, another structure may be used in which a plurality of phosphor layers 3 are formed, both of the first and second electrode are prepared as the transparent electrodes, the back electrode 4 is prepared as a black-colored electrode, a structure for sealing the entire portion or one portion of the display device 10 is further provided, or a color-converting structure that converts the color of light emission from the phosphor layer 3 is further prepared in front of the color filter 17.

The following description will discuss the respective components of this display device 10.

<Substrate>

A material that can support respective layers formed thereon, and also has a high electric insulating property is used as the transparent substrate 1. Moreover, the material needs to have a light transmitting property to a light wavelength that is emitted from the phosphor layer 3. Examples of the material include glass, such as corning 1737, quartz, ceramics and the like. In order to prevent alkaline ion or the like, contained in normal glass, from giving adverse effects to the light-emitting device, non-alkaline glass, or soda lime glass, formed by coating alumina or the like as an ion barrier layer on the glass surface, may be used. However, these materials are exemplary only, and the material of the transparent substrate 1 is not particularly limited by these. Moreover, with a structure in which no light is taken out from the substrate side, the above-mentioned light transmitting property is not required, and a material having no light transmitting property may also be used. Examples of the material include a metal substrate, a ceramic substrate, a silicon wafer and the like with an insulating layer being formed on the surface thereof.

<Electrode>

Any material may be used as the transparent electrode 2 on the side from which light is taken out as long as it has a light-transmitting property so as to take light emission generated in the phosphor layer 3 out of the layer, and in particular, those materials having a high transmittance within a visible light range are desirably used. Moreover, those materials that exert low resistance are preferably used, and in particular, those materials having a superior adhesive property to a protective layer 18 and the phosphor layer 3 are desirably used. In particular, preferable examples of materials for the transparent electrode 2 include those ITO materials ($In_2O_3$ doped with $SnO_2$, referred to also as indium tin oxide), metal oxides mainly including InZnO, ZnO, $SnO_2$ or the like, metal thin films such as Pt, Au, Pd, Ag, Ni, Cu, Al, Ru, Rh, and Ir, or conductive polymers, such as polyaniline, polypyrrole, PEDOT/PSS and polythiophene; however, the material is not particularly limited by these.

For example, the ITO material may be formed into a film by using a film-forming method, such as a sputtering method, an electron beam vapor deposition method and an ion plating method so as to improve the transparency thereof or to lower the resistivity thereof. Moreover, after the film-forming process, the film may be surface-treated by a plasma treatment or the like so as to control the resistivity thereof. The film thickness of the transparent electrode 2 is determined based upon the sheet resistance value and visible light transmittance to be required.

Moreover, any of generally well-known conductive materials may be applied as the back electrode 4 on the side from which no light is taken out. Preferable examples thereof include metal oxides, such as ITO, InZnO, ZnO and $SnO_2$, metals, such as Pt, Au, Pd, Ag, Ni, Cu, Al, Ru, Rh and Ir, or conductive polymers, such as polyaniline, polypyrrole and PEDOT[poly(3,4-ethylenedioxythiophene)]/PSS(polystyrene sulfonate), or conductive carbon.

The transparent electrode 2 and the back electrode 4 may have a structure in which a plurality of electrodes are formed into a striped pattern within the layer. Moreover, both of the transparent electrodes 2 (first electrodes) and the back electrodes 4 (second electrodes) may be formed into a plurality of stripe-shaped electrodes with the respective striped-shaped electrodes of the first electrodes 2 and all the stripe-shaped electrodes of the second electrodes 4 being set to a twisted positional relationship, and with projected shapes onto the light-emitting face of the respective stripe-shaped electrodes of the first electrodes 2 and projected shapes onto the light emitting face of all the stripe-shaped electrodes of the second electrodes 4 being made to intersect with one another. In this case, it is possible to obtain a display in which, by applying a voltage to electrodes respectively selected from the stripe-shaped electrodes of the first electrodes and the stripe-shaped electrodes of the second electrodes, a predetermined position is allowed to emit light.

<Phosphor Layer>

The phosphor layer 3, which is sandwiched between the transparent electrode 2 and the back electrode 4, has either one of the following two structures.

(i) A structure (see FIG. 36) corresponding to an aggregated body of n-type semiconductor particles, in which a p-type semiconductor 23 is segregated between the particles. Here, the aggregated body of the n-type semiconductor particles 21 itself forms a layer.

(ii) A structure (see FIG. 38) in which n-type semiconductor particles 21 are dispersed in a medium of a p-type semiconductor 23.

Moreover, the respective n-type semiconductor particles 21 forming the phosphor layer 3 are preferably electrically joined to the electrodes 2 and 4 through the p-type semiconductor 23.

<Illuminant>

The material for n-type semiconductor particles 21 is an n-type semiconductor material having a majority of carriers as electrons that exhibits an n-type conductive property. The material may be a compound semiconductor located between Group 12 to Group 16. Moreover, the material may be a compound semiconductor located between Group 13 to Group 15. More specifically, the material has an optical band gap size in a range of visible light rays, and examples thereof include: ZnS, ZnSe, GaN, InGaN, AlN, GaAlN, GaP, CdSe, CdTe, SrS and CaS, serving as host crystals, and these may be used as host crystals, or may include as additives, one or a plurality of kinds of atoms or ions, selected from the group consisting of Cu, Ag, Au, Ir, Al, Ga, In, Mn, CI, Br, I, Li, Ce, Pr, Nd, Pm, Sm, Eu, Gd, Tb, Dy, Ho, Er, Tm and Yb. The light emission color from the phosphor layer 20 is also determined by the kinds of these elements.

In contrast, the material for the p-type semiconductor 23 is a p-type semiconductor material having a majority of carriers as holes that exhibits a p-type conductive property. Examples of this p-type semiconductor material include compounds, such as $Cu_2S$, ZnS, ZnSe, ZnSSe, ZnSeTe and ZnTe, and nitrides, such as GaN and InGaN. Among these p-type semiconductor materials, $Cu_2S$ and the like inherently exhibit a p-type conductive property; however, with respect to the other materials, one or more kinds of elements, selected from the group consisting of nitrogen, Ag, Cu and In, are added thereto as additives and used. Moreover, a chalcopyrite type compound, such as $CuGaS_2$ and $CuAlS_2$, that exerts a p-type conductive property may be used.

The display device 10 relating to the present embodiment is characterized in that the phosphor layer 3 is provided with: either one of (i) the structure in which the p-type semiconductor 23 is segregated between the particles of the n-type semiconductor particles 21 (FIG. 36) and (ii) the structure in which the n-type semiconductor particles 21 are dispersed in a medium of the p-type semiconductor 23 (FIG. 38). As with a conventional example, when the medium that is electrically joined to semiconductor particles is indium tin oxide, electrons that reach the semiconductor particles are allowed to emit light; however, since the hole concentration of indium tin oxide is small, holes to be recombined become insufficient. Therefore, the light emission with high luminance by the recombination between electrons and holes is not expected. In order to obtain continuous light emission having, in particular, high luminance and high efficiency, the present inventors try to provide a structure by which, in the phosphor layer 3, holes can be efficiently injected together with the injection of electrons. In order to realize the structure, it is necessary to allow many holes to reach the inside of each illuminant particle or the interface of the particles, and it is also necessary to quickly carry out the injection of holes from the electrode opposing the injection electrode for electrons, while the holes are allowed to reach the illuminant particles or the interface thereof. After extensive studies, the present inventors have found that, by using either one of the above-mentioned structures (i) and (ii) as the structure of the phosphor layer 3, electrons can be efficiently injected to the inside of each of n-type semiconductor particles or the interface thereof while holes are also efficiently injected thereto. That is, in accordance with the phosphor layer 3 having each of the above-mentioned structures, electrons, injected from the electrode, are allowed to reach the n-type semiconductor particles 21 through the p-type semiconductor 23, while many holes are allowed to reach the illuminant particles from the other electrode so that light is efficiently emitted by the recombination of the electrons and the holes. With this structure, it becomes possible to realize a plane light-emitting device that can emit light with high luminance at a low voltage, and consequently to achieve the present invention. Moreover, by introducing a donor or an acceptor, light emissions, derived from the recombination of free electrons and holes captured by the acceptor, the recombination of free holes and electrons captured by the donor, and the paired donor and acceptor, can also be obtained. Moreover, a light emission derived from an energy shift caused by the presence of other adjacent ionic species can be obtained.

In a case where a zinc-based material, such as ZnS, is used as the n-type semiconductor particles 21 of the phosphor layer 3, an electrode made of a metal oxide containing zinc, such as ZnO, AZO (made by doping zinc oxide, for example, with aluminum) and GZO (made by doping zinc oxide, for example, with gallium), is preferably used as, at least, either one of the transparent electrode 2 and the back electrode 4. The present inventors have found that, by using a combination of specific n-type semiconductor particles 21 and a specific transparent electrode 2 (or a back electrode 4), light emission with high efficiency is obtained.

That is, consideration, given to the work function of the transparent electrode 2 (or the back electrode 4), shows that the work function of ZnO is 5.8 eV, while the work function of ITO (indium tin oxide) conventionally used as a transparent electrode is 7.0 eV. In contrast, since the work function of the zinc-based material used as the n-type semiconductor particles 21 of the phosphor layer 3 is 5 to 6 eV, the work function of ZnO, which is closer to the work function of a zinc-based material in comparison with that of ITO, provides an advantage that the electron injecting property to the phosphor layer 3 is improved. This advantage is also obtained when a zinc-based material, such as AZO and GZO, is used as the transparent electrode 2 (or the back electrode 4).

Figure 39A:
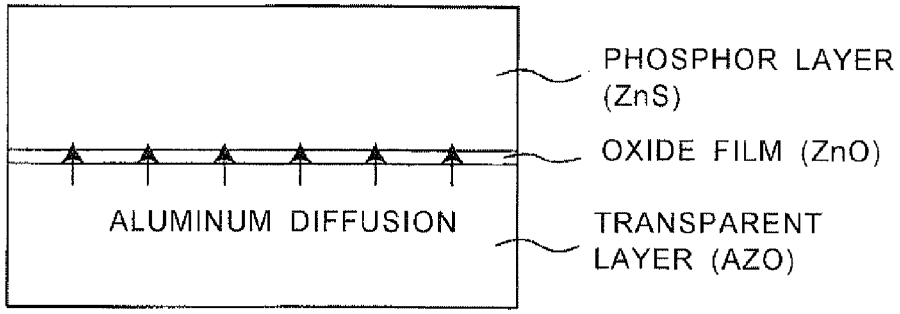
FIG. 39A is a schematic view that shows a proximity of an interface between the phosphor layer made of ZnS and a transparent electrode (or a back electrode) made of AZO.
Figure 39B:
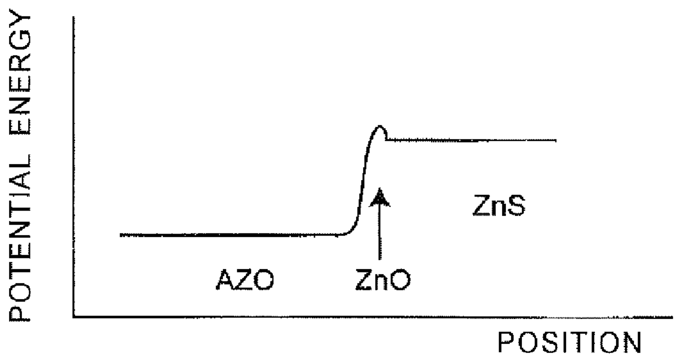
FIG. 39B is a schematic view that shows a displacement in potential energy of FIG. 39A.
Figure 40A:
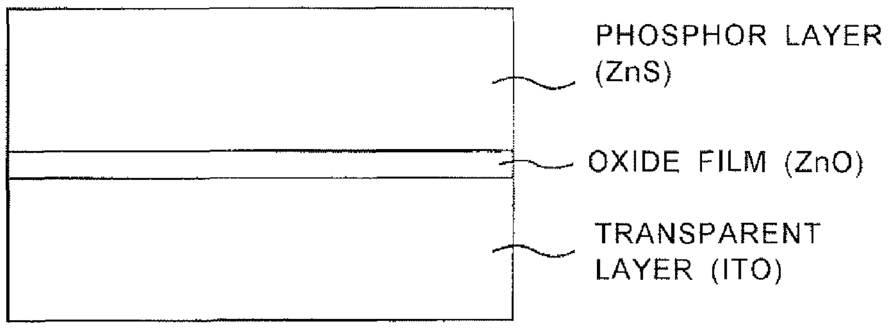
FIG. 40A is a schematic view relating to a comparative example that shows an interface between a phosphor layer made of ZnS and a transparent electrode made of ITO.
Figure 40B:
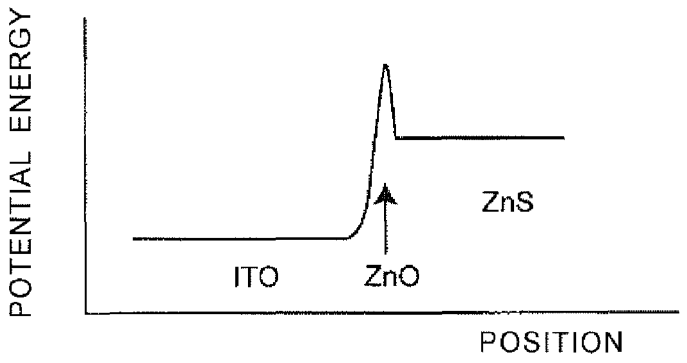
FIG. 40B is a schematic view that shows a displacement in potential energy of FIG. 40A.

FIG. 39A is a schematic view that shows the vicinity of an interface between the phosphor layer 3 made of ZnS and the transparent electrode 2 (or the back electrode 4) made of AZO. FIG. 39B is a schematic view that explains a displacement of potential energy of FIG. 39A. FIG. 40A, which shows a comparative example, is a schematic view that shows the vicinity of an interface between a light-emitting electrode 3 made of ZnS and a transparent electrode made of ITO, and FIG. 40B is a schematic view that explains a displacement of potential energy of FIG. 40A.

As shown in FIG. 39A, in the above-mentioned preferred example, since the n-type semiconductor particles 21 forming the phosphor layer 3 is made of a zinc-based material (ZnS) while the transparent electrode 2 (or the back electrode 4) is made of a zinc oxide-based material (AZO), an oxide to be formed on the interface between the transparent electrode 2 (or the back electrode 4) and the phosphor layer 3 is zinc oxide (ZnO). Moreover, on the interface, a doping material (Al) is diffused upon forming a film, with the result that an oxide film having low resistance is formed thereon. Moreover, the above-mentioned zinc oxide-based (AZO) transparent electrode 2 (or the back electrode 4) has a crystal structure of a hexagonal system, and since the zinc-based material (ZnS) corresponding to the n-type semiconductor substance 21 forming the phosphor layer 3 also forms a hexagonal system, or has a crystal structure of a cubic system, little strain is caused on the interface between the two substances, resulting in a small energy barrier. Consequently, as shown in FIG. 39B, the displacement in potential energy is kept in a low level.

In contrast, in the comparative example, the transparent electrode is made of ITO that is not a zinc-based material, as shown in FIG. 40A; therefore, since the oxide film (ZnO) formed on the interface has a crystal structure different from that of ITO, the energy barrier on the interface becomes greater. Therefore, as shown in FIG. 40B, the displacement in potential energy becomes greater on the interface to cause a reduction in the light-emitting efficiency of the light-emitting element.

As described above, in a case where a zinc-based material, such as ZnS and ZnSe, is used as the n-type semiconductor particles 21 of the phosphor layer 3, by combining it with the transparent electrode 2 (or the back electrode 4) made of a zinc oxide-based material, it becomes possible to provide a display device with superior light-emitting efficiency.

In the above-mentioned example, an explanation has been given by exemplifying AZO doped with aluminum and GZO doped with gallium as the material for the transparent electrode 2 (or the back electrode 4) containing zinc; however, the same effects can be obtained even when zinc oxide, doped with at least one kind of material selected from the group consisting of aluminum, gallium, titanium, niobium, tantalum, tungsten, copper, silver and boron, is used.

<Manufacturing Method>

The following description will discuss one example of a method for manufacturing the display device 10 in accordance with eleventh embodiment. FIGS. 41 to 44 are schematic perspective views that show the respective processes of the manufacturing method of the present embodiment.

(1) First, a glass substrate is prepared as a transparent substrate 1.

(2) On the glass substrate 1, a black matrix 19 is formed by using a resin material containing carbon black through a photolithography method. The black matrix 19 is disposed virtually in a lattice shape by using a plurality of linear patterns that extend in a first direction in parallel with the surface of the glass substrate 1 with predetermined intervals and a plurality of linear patterns that extend in a direction orthogonal to the first direction with predetermined intervals.

(3) Next, by using color resists, colored patterns are formed between adjacent matrix lines of the black matrix 19 by a photolithography method. These processes are repeatedly carried out for each of the colors of R, G and B so that a color filter 17 is formed.

(4) Next, a protective layer 18 is formed on each of the colored patterns of the color filter 17, and a transparent electrode 2 is formed on the protective layer 18 by a sputtering method. As the material for the transparent electrode 2, ITO is used, and the transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

(5) Next, a phosphor layer 3 having a flat face is formed on the protective layer 18 and the transparent electrode 2 of the color filter 17. The phosphor layer 3 is formed in the following manner. First, powdered ZnS and $Cu_2S$ are respectively charged into a plurality of evaporating sources, and an electron beam is applied to each of the materials under vacuum (about $10^{-6}$ Torr) so as to be film-formed on the substrate 1 as the phosphor layer 3. At this time, the substrate temperature is set to 200° C. so that ZnS and $Cu_2S$ are commonly vapor deposited.

Figure 41:
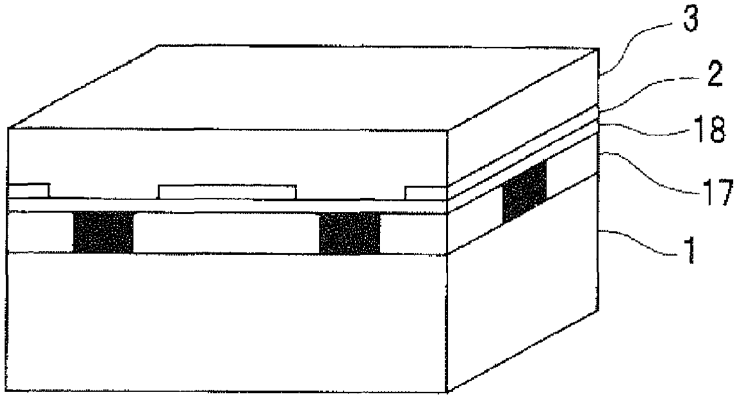
FIG. 41 is a schematic perspective view that shows one process of a method for manufacturing a display device in accordance with eleventh embodiment of the present invention.

(6) After forming the film, this is subjected to a firing process at 700° C. for about one hour in a sulfur atmosphere. By examining this film by using the X-ray diffraction and the SEM, the polycrystal structure with minute ZnS crystal grains and the segregated portion of $Cu_xS$ can be observed. Although the reason for this has not been clarified, it is considered that a phase separation occurs between ZnS and $Cu_xS$, with the result that the above-mentioned segregated structure is formed (FIG. 41).

Figure 42:
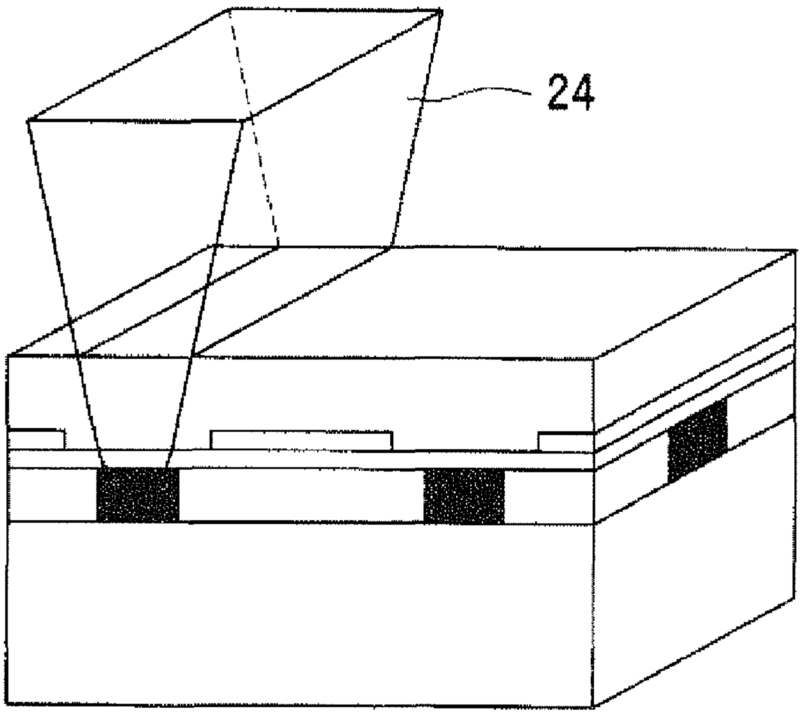
FIG. 42 is a schematic perspective view that shows another process of the method for manufacturing a display device in accordance with eleventh embodiment of the present invention.
Figure 43:
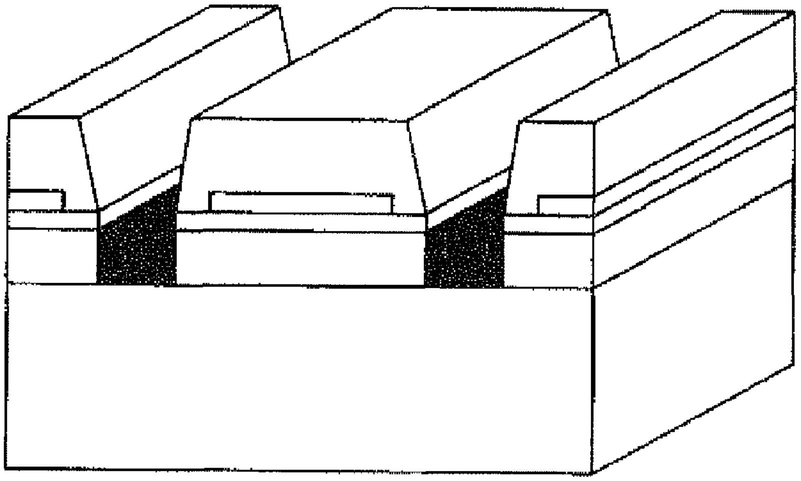
FIG. 43 is a schematic perspective view that shows still another process of the method for manufacturing a display device in accordance with eleventh embodiment of the present invention.

(7) Next, a YAG laser beam 24 having a virtually linear shape is intermittently applied to the black matrix 19 that extends in the first direction from above the phosphor layer 3 so that the phosphor layer 3 is patterned (FIG. 42). Additionally, the wavelength of the YAG laser 24 has a wavelength that is longer than the wavelength corresponding to a band gap relative to the protective layer 18 and the phosphor layer 3 that are virtually optically transparent, so that it is not absorbed so much by the protective layer 18 and the phosphor layer 3, but absorbed by the black matrix 19 located beneath these layers; thus, together with the surface layer portion of the black matrix 19, the protective layer 18 and the phosphor layer 3 are removed (FIG. 43).

(8) Next, a back electrode 4 is formed on the phosphor layer 3 by a sputtering method. As the material for the back electrode 4, Pt is used, and the back electrode 4 is formed in a manner so as to be located between adjacent lines of the black matrix 19 and to extend virtually in parallel therewith, with predetermined intervals between one another, relative to the matrix lines of the black matrix 19 that extend in the second direction. As a result, the transparent electrode 2 and the back electrode 4 are made orthogonal to each other on the colored patterns of the color filter 17, and also made face to face with each other with the phosphor layer 3 interposed therebetween.

(9) Next, an insulating protective layer 11 is formed on the phosphor layer 3 and the back electrode 4.

By using the above-mentioned processes, a display device 10 of the present embodiment is obtained.

Figure 44:
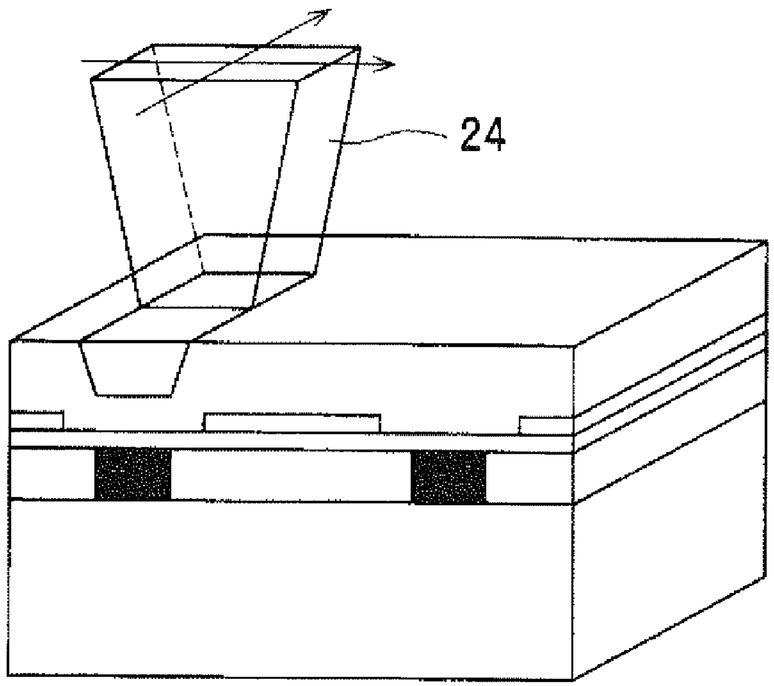
FIG. 44 is a schematic perspective view that shows the other process of the method for manufacturing a display device in accordance with eleventh embodiment of the present invention.

Additionally, the spot shape of the laser 24 may be formed into a virtually dot shape. In this case, the patterning process of the phosphor layer 3 can be carried out by scanning the laser spot in the first direction as well as in the second direction (FIG. 44).

Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern.

<Effects>

In the display device in accordance with eleventh embodiment, by removing the phosphor layer 3 located in an interpixel region between adjacent pixels over the same plane of the phosphor layer 3, a non-pixel region 3*b* having a higher resistance than that of the phosphor layer 3 of the pixel region 3*a* is formed. With this arrangement, even with a display device using a low resistance phosphor layer 3 that exhibits electroluminescent light emission, it is possible to greatly reduce crosstalk at the time of a displaying operation, and consequently to improve the display quality.

Twelfth Embodiment

<Schematic Structure of Display Device>

Figure 45:
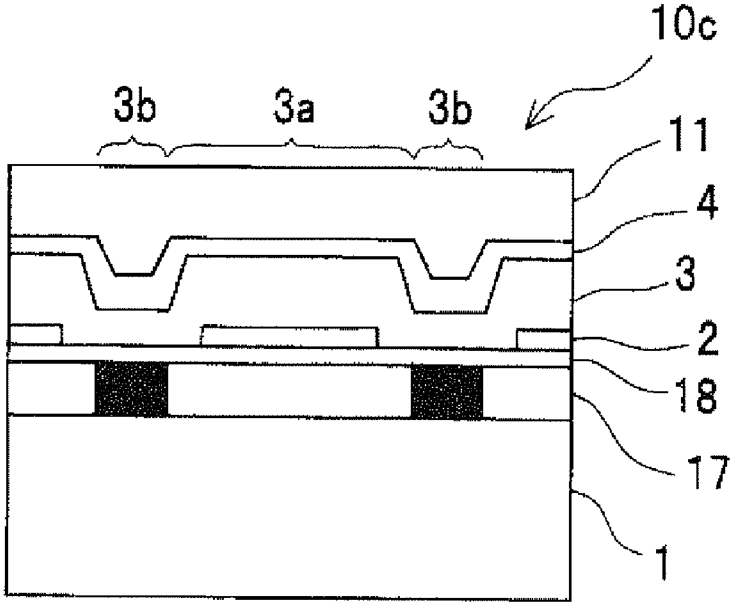
FIG. 45 is a schematic cross-sectional view that shows a structure of a display device in accordance with twelfth embodiment of the present invention.

FIG. 45 is a schematic perspective view that shows a structure of a display device 10*c* in accordance with twelfth embodiment of the present invention. This display 10*c* is different from the display device of the eleventh embodiment in that, in the interpixel region between the adjacent pixels, only an upper layer portion of the phosphor layer 3 is removed so that the respective pixel regions 3*a* are divided from each other. The regions from which the upper layer portions of the phosphor layer 3 have been removed are allowed to have a relatively thinner film thickness of the phosphor layer 3 in comparison with those peripheral regions without being removed portions, and consequently to have a relatively higher resistance in the direction in parallel with the light-emitting surface.

<Manufacturing Method>

Figure 46:
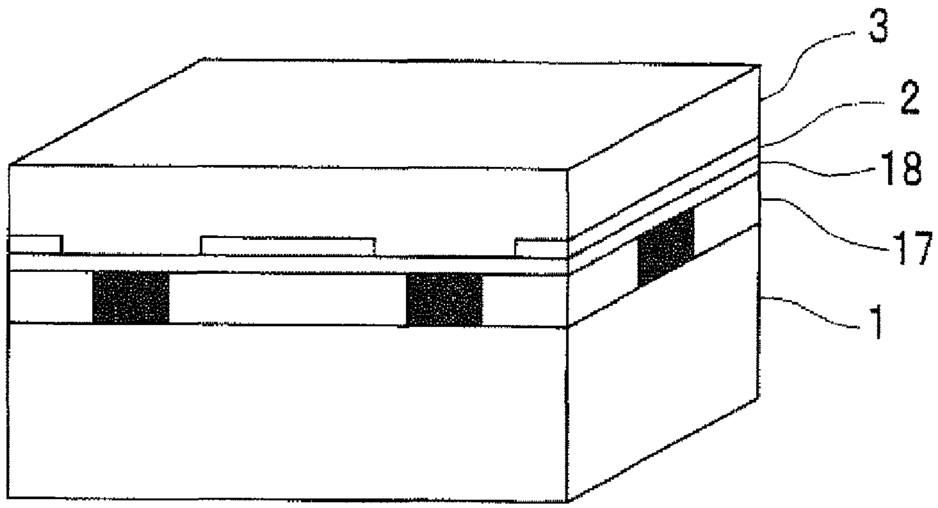
FIG. 46 is a schematic perspective view that shows one process of a method for manufacturing a display device in accordance with twelfth embodiment of the present invention.
Figure 47:
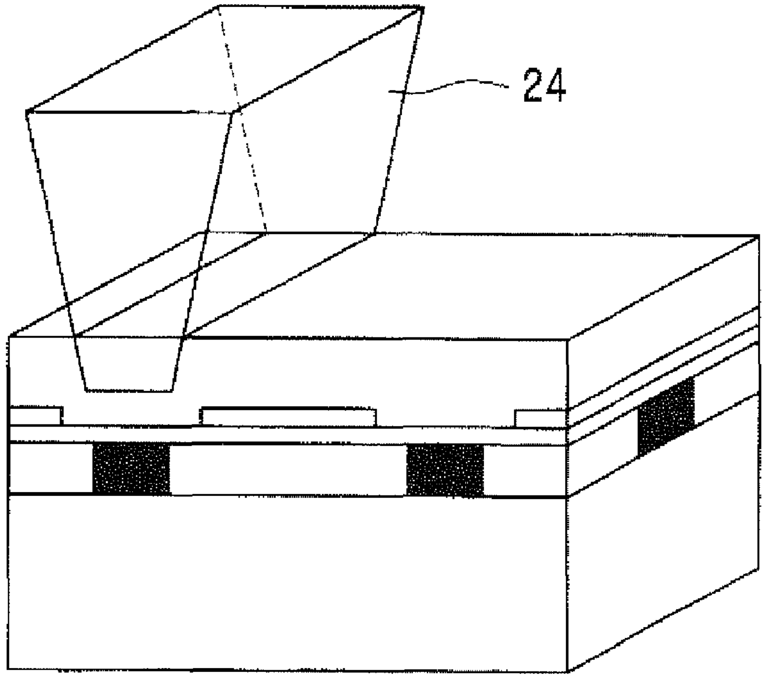
FIG. 47 is a schematic perspective view that shows another process of the method for manufacturing a display device in accordance with twelfth embodiment of the present invention.

The following description will discuss one example of a method for manufacturing the display device 10*c* in accordance with twelfth embodiment. FIGS. 46 to 47 are schematic perspective views that show the respective processes of the manufacturing method of the present embodiment.

(1) A phosphor layer 3 is formed on a glass substrate 1 in a solid state in the same manner as in the method for manufacturing the display device in accordance with the aforementioned first embodiment (FIG. 46).

Figure 48:
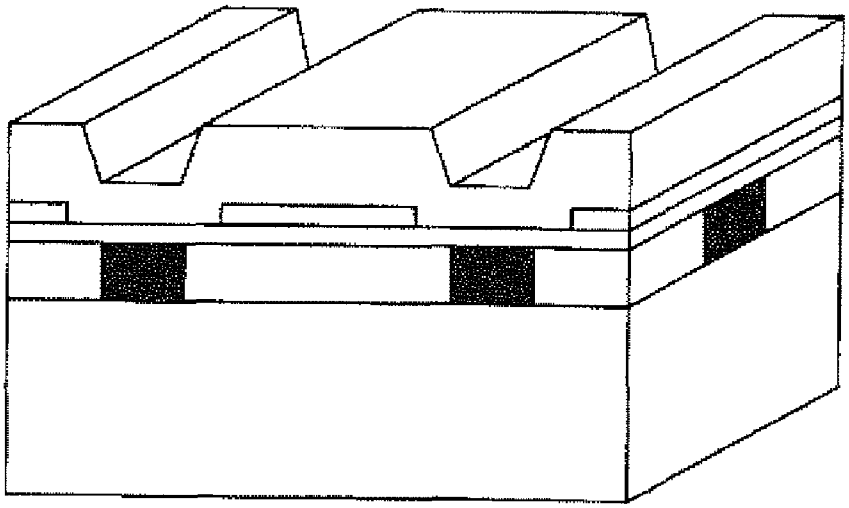
FIG. 48 is a schematic perspective view that shows still another process of the method for manufacturing a display device in accordance with twelfth embodiment of the present invention.

(2) Next, a virtually linear excimer laser 24 is applied to an area that is virtually in parallel with the stripe-shaped transparent electrode 2 and located between adjacent transparent electrodes 2 from above the phosphor layer 3 so that the phosphor layer 3 is patterned (FIG. 47). The excimer laser 24 generates light having a comparatively short wavelength in the ultraviolet-ray range. In this wavelength, since the laser energy is absorbed by the phosphor layer 3 that is virtually transparent, only the portion irradiated with the laser 24 can be selectively heated locally so that the upper layer portion of the phosphor layer 3 is removed (FIG. 48).

(3) Next, in the same manner as in the manufacturing method for the display device of the aforementioned eleventh embodiment, a back electrode 4 and a protective layer 11 are formed on the phosphor layer 3. The back electrode 4 and the transparent electrode 2 are made orthogonal to each other on the colored patterns of the color filter 17, and also made face to face with each other with the phosphor layer 3 interposed therebetween.

By using the above-mentioned processes, the display device 10*c* of the present embodiment is obtained.

Figure 49:
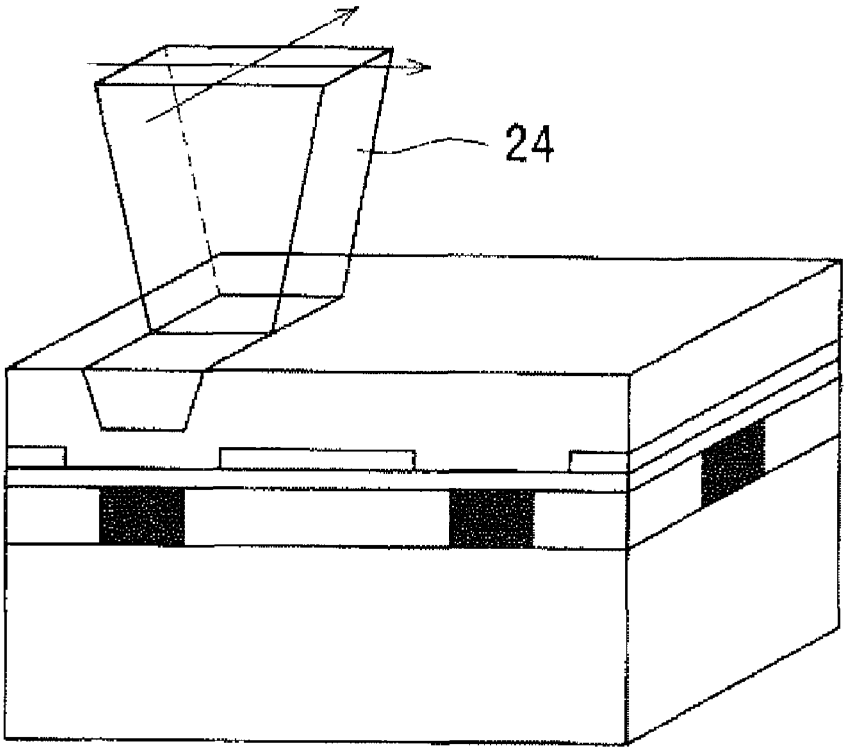
FIG. 49 is a schematic perspective view that shows the other process of the method for manufacturing a display device in accordance with twelfth embodiment of the present invention.

Additionally, the spot shape of the laser 24 may be formed into a virtually dot shape. In this case, the patterning process of the phosphor layer 3 can be carried out by scanning the laser spot 24 in the first direction as well as in the second direction (FIG. 49).

Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern.

<Effects>

In the display device 10*c* of the present embodiment, by removing the phosphor layer 3 located in an interpixel region between adjacent pixels over the same plane of the phosphor layer 3, an area that makes the phosphor layer 3 disconnected is formed so that a non-pixel region 3*b* having a higher resistance than that of the phosphor layer 3 of the pixel region 3*a* is formed. With this arrangement, even with a display device using a low resistance phosphor layer that exhibits electroluminescent light emission, it is possible to greatly reduce crosstalk at the time of a displaying operation, and consequently to improve the display quality.

Thirteenth Embodiment

<chematic Structure of Display Device>

Figure 50:
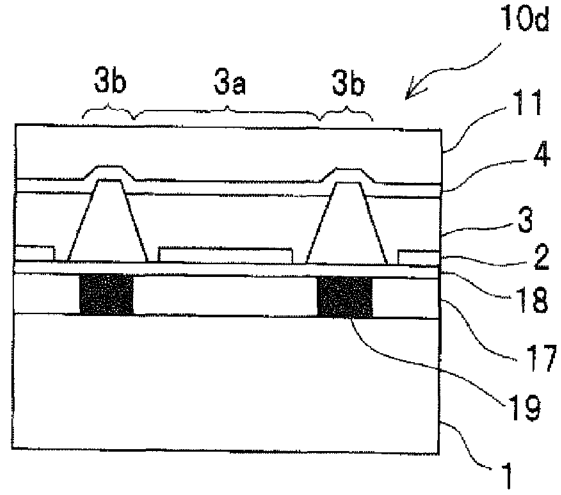
FIG. 50 is a schematic cross-sectional view that shows a structure of a display device in accordance with thirteenth embodiment of the present invention.

FIG. 50 is a schematic cross-sectional view that shows a structure of a display device 10*d* in accordance with thirteenth embodiment. This display 10*d* is different from the display device of eleventh embodiment in that, in the interpixel region between the adjacent pixels 3*a*, a barrier plate 26 is formed as a non-pixel region 3*b* so that the respective pixel regions 3*a* are divided within the phosphor layer 3.

As the barrier plate 26, a material having higher resistance in comparison with the phosphor layer 3 can be used. The barrier plate 26 may be formed by using, for example, an organic material, an inorganic material and the like. Examples of the organic material include polyimide resin, acrylic resin, epoxy resin and urethane resin. Moreover, examples of the inorganic material include $SiO_2$, SiNx, alumina and the like, or a composite structure, such as a laminated structure and a mixed structure (for example, a binder in which an inorganic filler is dispersed) of these materials, may be used. The shape of the barrier plate 26 is not particularly limited, but the height of the barrier plate 26 is preferably set to about 0.5 to 1.5 times the film thickness of the phosphor layer 3. Moreover, the width of the barrier plate 26 is preferably set to 0.5 to 1.5 times the interval between the adjacent transparent electrodes.

<Manufacturing Method>

The following description will discuss one example of a method for manufacturing a display device 10*d* in accordance with thirteenth embodiment. FIGS. 51 to 54 are schematic perspective views that show the respective processes of the manufacturing method of the present example. Additionally, with respect to the phosphor layers made of the aforementioned other materials, the same manufacturing method may also be utilized.

Figure 51:
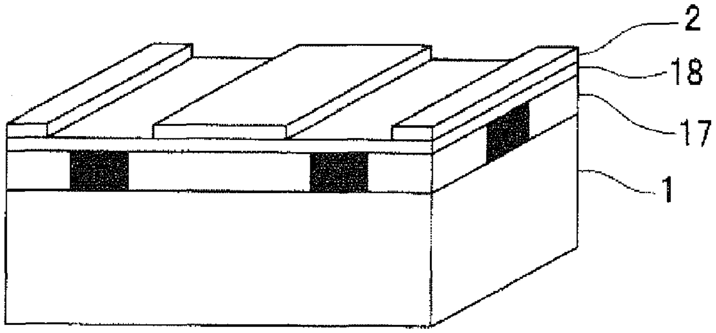
FIG. 51 is a schematic perspective view that shows one process of a method for manufacturing a display device in accordance with thirteenth embodiment of the present invention.

(1) In the same manner as in the method for manufacturing the display device of the aforementioned eleventh embodiment, a color filter 17 is formed on a glass substrate 1, and a first protective layer 18 is formed thereon. Moreover, a transparent electrode 2 is formed on the first protective layer 18. The transparent electrode 2 is formed so as to be located between adjacent lines of the black matrix 19 and to extend virtually in parallel therewith, with predetermined intervals between one another, relative to the matrix lines of the black matrix 19 that extend in the first direction (FIG. 51).

Figure 52:
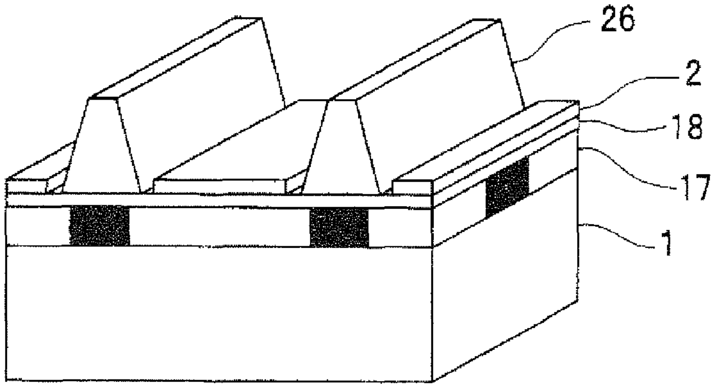
FIG. 52 is a schematic perspective view that shows another process of the method for manufacturing a display device in accordance with thirteenth embodiment of the present invention.

(2) Next, barrier plates 26 are formed on the first protective layer 18. The barrier plates 26 are formed in the following manner. First, a glass paste in which alumina powder is dispersed is formed into a stripe pattern by a screen printing process, with each stripe being located between the adjacent transparent electrodes 2 so as to extend in a first direction. Then, this is fired to obtain barrier plates 26 formed into a desired pattern (FIG. 52).

Figure 53:
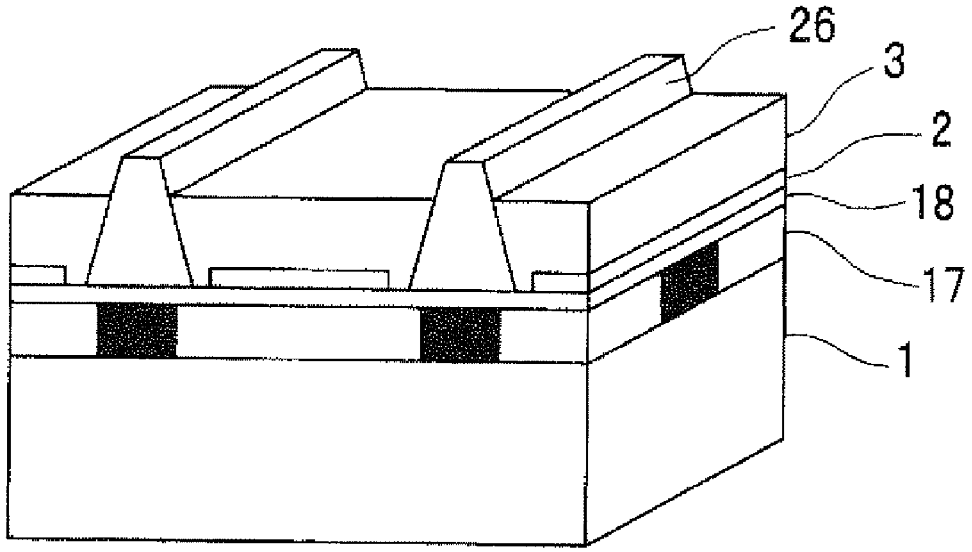
FIG. 53 is a schematic perspective view that shows still another process of the method for manufacturing a display device in accordance with thirteenth embodiment of the present invention.

(3) Next, in the same manner as in the method for manufacturing the display device relating to the aforementioned eleventh embodiment, a phosphor layer 3 is formed on the transparent electrode 2. The barrier plates 26 are shield by using a metal mask (FIG. 53).

(4) Next, in the same manner as in the method for manufacturing the display device relating to the aforementioned eleventh embodiment, a back electrode 4 and a second protective layer 11 are formed on the phosphor layer 3. The back electrode 4 is made orthogonal to the transparent electrode 2 on the colored patterns of the color filter 17, and also made face to face therewith, with the phosphor layer 3 interposed therebetween.

By using the above-mentioned processes, a display device 10*d* of the present embodiment is obtained.

Figure 54:
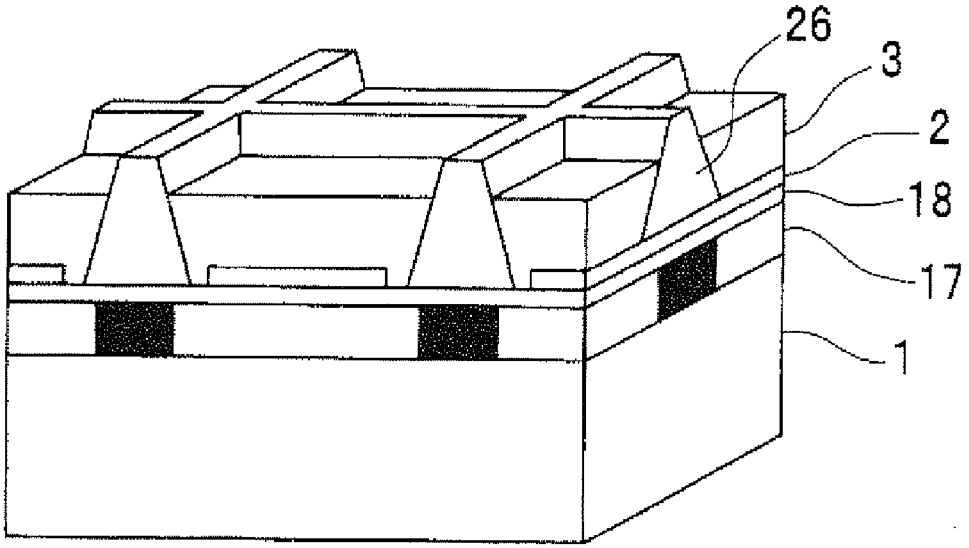
FIG. 54 is a schematic perspective view that shows the other process of the method for manufacturing a display device in accordance with thirteenth embodiment of the present invention.

Additionally, the pattern shape of the barrier plates 26 may be formed into a virtually lattice shape. In this case, each of the barrier plates 26 located in a manner so as to extend in the second direction is positioned between the adjacent back electrodes 4 (FIG. 54).

Moreover, the method for forming the barrier plates 26 is not intended to be limited by the screen printing method, and other methods, such as etching by the photolithography method, a sand-blasting method and an ink-jet method, may be used.

<Effects>

In the display device 10*d* of the present embodiment, each of the barrier plates 26, mainly made of an insulating resin, is formed in an interpixel region between adjacent pixels 3*a* over the same plane of the phosphor layer 3 so that a non-pixel region 3*b* having a higher resistance than that of the phosphor layer 3 of the pixel region 3*a* is formed. With this arrangement, even with a display device using a low resistance phosphor layer 3 that exhibits electroluminescent light emission, it is possible to greatly reduce crosstalk at the time of a displaying operation, and consequently to improve the display quality.

Fourteenth Embodiment

<Manufacturing Method>

Figure 55:
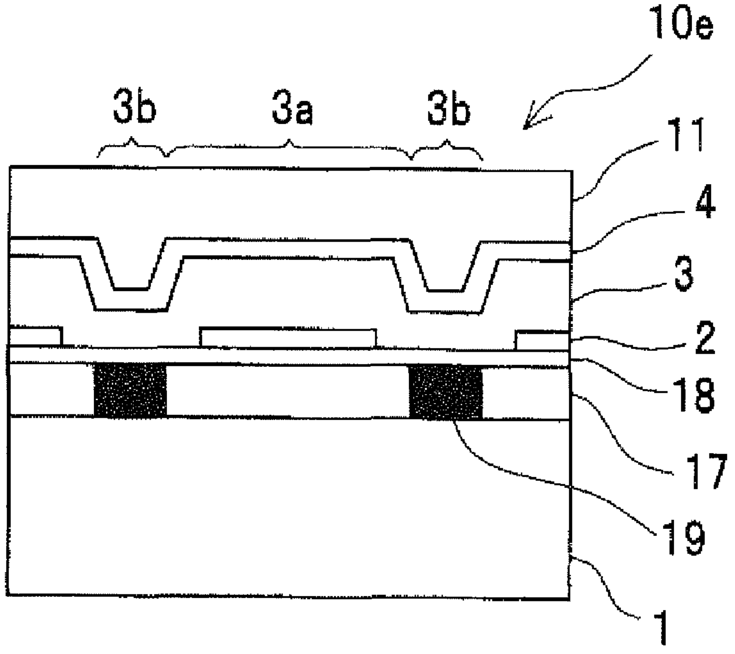
FIG. 55 is a schematic cross-sectional view that shows a structure of a display device in accordance with fourteenth embodiment of the present invention.

FIG. 55 is a schematic structural view that shows a display device 10*e* in accordance with fourteenth embodiment. This display 10*e*, which has the same structure and shape as those of the display device in accordance with twelfth embodiment, is different therefrom in its manufacturing method. The following description will discuss one example of the method for manufacturing the display device 10*e* in accordance with fourteenth embodiment. FIGS. 56 to 61 are schematic perspective views that show the respective processes of the manufacturing method of the present example.

(1) In the same manner as in the method for manufacturing the display device of the aforementioned eleventh embodiment, a transparent electrode 2 is formed on a glass substrate 1. The transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

Figure 56:
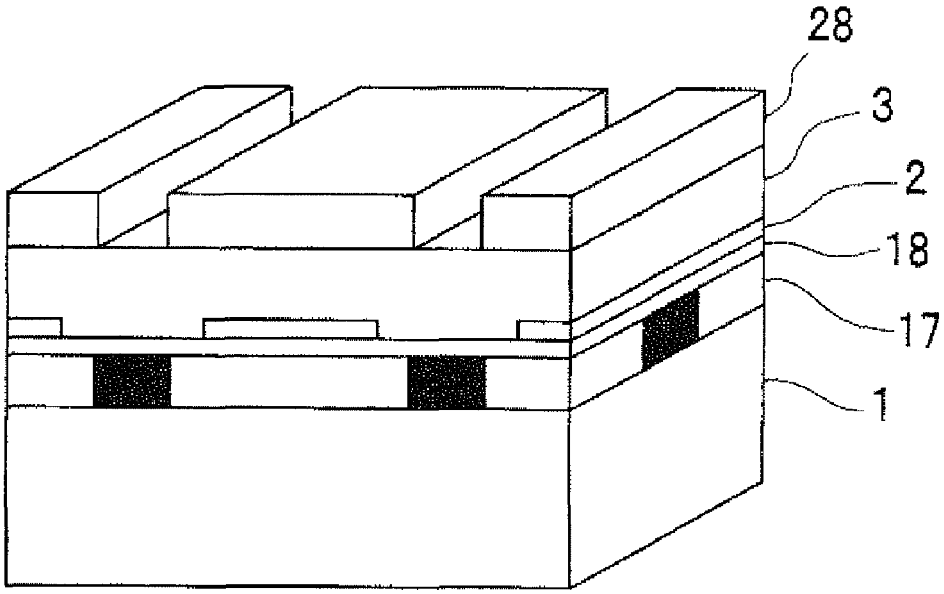
FIG. 56 is a schematic perspective view that shows one process of a method for manufacturing a display device in accordance with fourteenth embodiment of the present invention.

(2) Thereafter, in the same manner as in the method for manufacturing the display device relating to the aforementioned eleventh embodiment, a phosphor layer 3 is formed thereon in a solid state, and this is then subjected to a photolithography method by using a photosensitive resist so that a mask pattern 28 is formed. This mask pattern 28 is designed so as to be located between adjacent transparent electrodes, and to extend in the first direction in parallel therewith, with openings formed therein with predetermined intervals from one another (FIG. 56).

Figure 57:
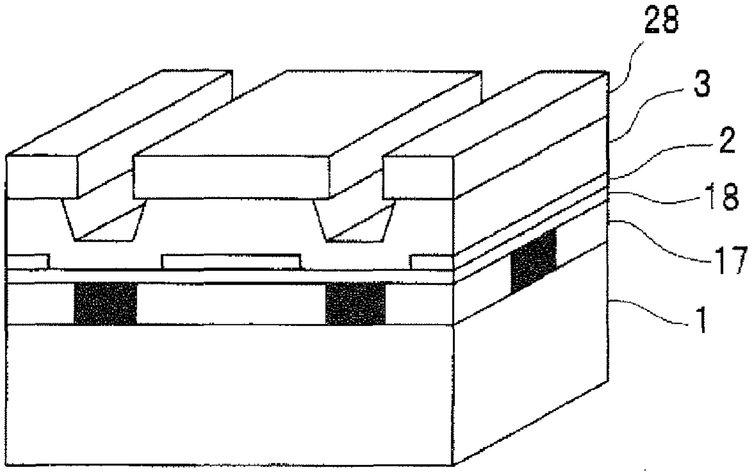
FIG. 57 is a schematic perspective view that shows another process of the method for manufacturing a display device in accordance with fourteenth embodiment of the present invention.

(3) Next, the exposed portions of the phosphor layer 3 are etched by using a dry etching method so as to have a desired thickness (FIG. 57).

Figure 58:
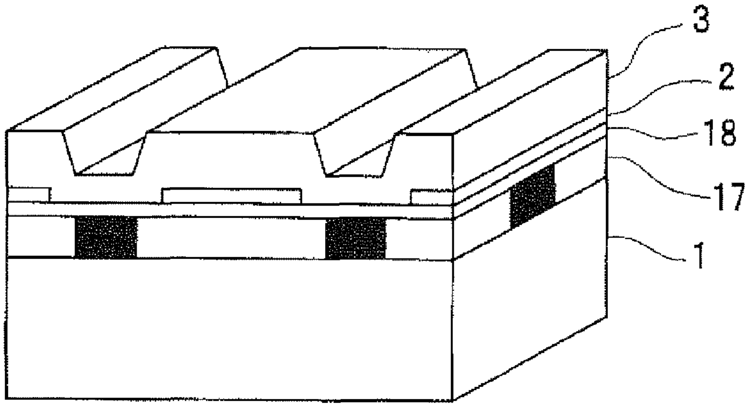
FIG. 58 is a schematic perspective view that shows still another process of the method for manufacturing a display device in accordance with fourteenth embodiment of the present invention.

(4) Next, the mask pattern 28 made of the photosensitive resist is removed (FIG. 58).

(5) Thereafter, in the same manner as in the method for manufacturing the display device relating to the aforementioned eleventh embodiment, a back electrode 4 and a protective layer 11 are formed on the phosphor layer 3. The back electrode 4 and the transparent electrode 2 are made orthogonal to each other on the colored patterns of the color filter 17, and also made face to face with each other, with the phosphor layer 3 interposed therebetween.

The display device 10*e* of the present example is obtained by the above-mentioned processes.

Figure 59:
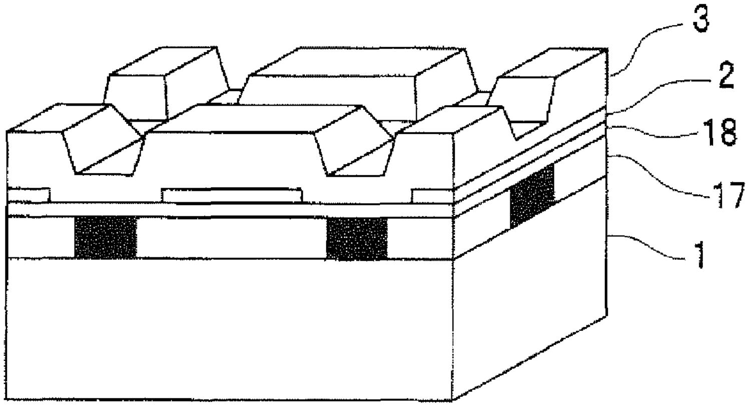
FIG. 59 is a schematic perspective view that shows the other process of the method for manufacturing a display device in accordance with fourteenth embodiment of the present invention.

Additionally, the pattern shape of the mask pattern 28 made of the photosensitive resist for use in the etching process is not limited by the above-mentioned stripe shape, but may be formed into a virtually lattice shape. In this case, the openings that are located to extend in the second direction, each being positioned between the adjacent back electrodes 4, are also placed in parallel with one another with predetermined intervals therebetween (FIG. 59).

Moreover, the etching method is not intended to be limited by the dry etching and another method, such as a wet-etching method and a sand-blasting method, may be used.

Figure 60:
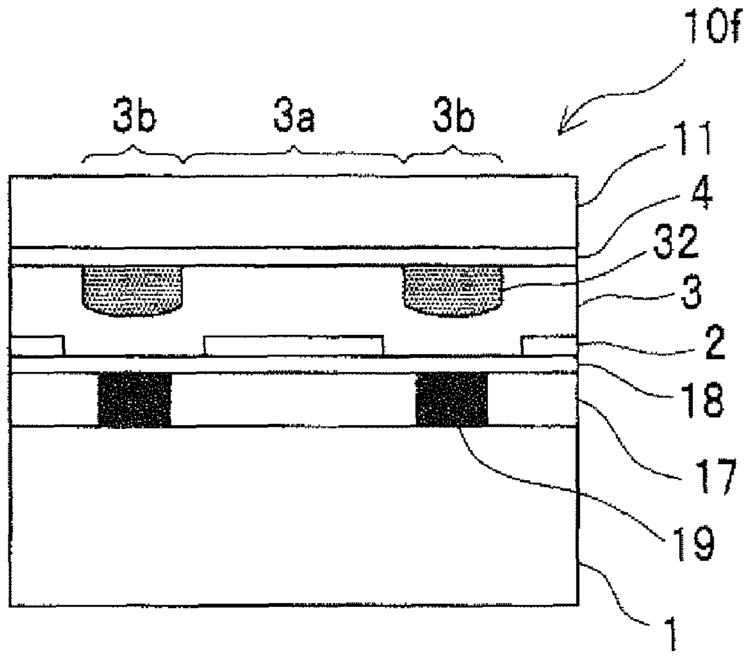
FIG. 60 is a schematic cross-sectional view that shows a structure of a modified example of a display device in accordance with fourteenth embodiment of the present invention.

Furthermore, FIG. 60 shows a display device 10*f* that is a modified example of fourteenth embodiment. This display device 10*f* differs from the display device 10*e* of fourteenth embodiment in that the etching process is not carried out to such an extent as to remove at least one portion of the phosphor layer 3. In the display device 10*f* of this modified example, during a wet etching process, the etching liquid that has permeated into the phosphor layer 3 to be dispersed therein forms a high resistance region 32 on one portion of the interpixel region (non-pixel region) 3*b* between the adjacent pixel regions 3*a* inside the phosphor layer 3.

<Effects>

In the display device of the present embodiment, an area having a higher resistance than that of the pixel region 3*a* is formed in an interpixel region 3*b* between the adjacent pixels over the same plane of the phosphor layer 3. Thus, even with a display device using a low resistance phosphor layer 3 that exhibits electroluminescent light emission, it is possible to greatly reduce crosstalk at the time of a displaying operation, and consequently to improve the display quality.

Fifteenth Embodiment

<Schematic Structure of Display Device>

Figure 61:
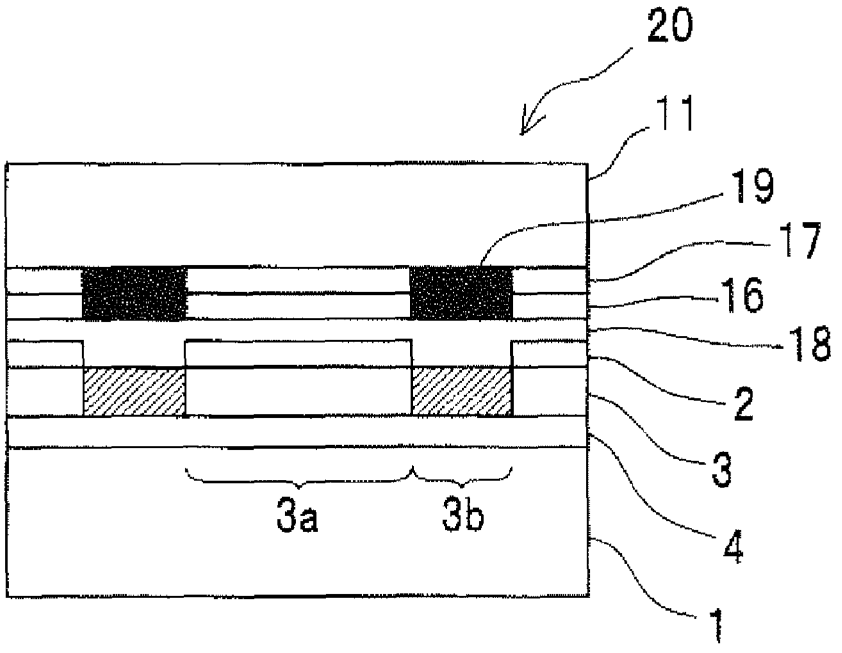
FIG. 61 is a schematic cross-sectional view that shows a structure of a display device in accordance with fifteenth embodiment of the present invention.

FIG. 61 is a schematic cross-sectional view that shows a cross-sectional structure of a display device 20 in accordance with fifteenth embodiment of the present invention. In this display device 20, a phosphor layer 3 containing an illuminant is formed between a transparent electrode 2 serving as a first electrode and a back electrode 4 serving as a second electrode. A substrate 1, which supports these electrodes, is formed adjacent to the back electrode 4. The transparent electrode 2 and the back electrode 4 are electrically connected to each other with a power supply interposed therebetween. When power is supplied from the power supply, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2, and is taken out from the display device 20. In the display device 20 according to the present embodiment, a DC power supply is used as the power supply. As shown in FIG. 61, the color conversion layer 16 and the color filter 17 are provided on the transparent electrode 2. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB. Moreover, the color conversion layer 16 has a function for converting a light emission color from the phosphor layer 3 into a long wavelength light ray, and, for example, in a case where a blue-color light ray is emitted from the phosphor layer 3, the blue-color light ray is converted into a green-color light ray or a red-color light ray by the color conversion layer 16, and is taken out.

On the other hand, not limited to the above-mentioned structure, for example, another structure may be used in which a plurality of phosphor layers 3 are formed, both of the first and second electrode are prepared as the transparent electrodes, the back electrode 4 is prepared as a black-colored electrode, or a structure for sealing the entire portion or one portion of the display device 20 by the protective layer 11 is further provided. When the light emission from the phosphor layer 3 corresponds to a white-color light ray, a structure that eliminates the necessity of the color conversion layer 16 is also available.

<Manufacturing Method>

The following description will discuss one example of a method for manufacturing a display device 20 in accordance with fifteenth embodiment.

(1) First, a glass substrate is prepared as a substrate 1.

(2) Next, a back electrode 4 is formed on the substrate 1 by using a sputtering method. In this case, Pt is used as the back electrode 4, and the back electrode 4 is formed as a plurality of linear patterns that extend in a first direction in parallel with the surface of the glass substrate 1, in parallel with one another, with predetermined intervals being formed therebetween.

(3) Next, a phosphor layer 3 is formed in a solid state from the glass substrate 1 to the back electrode 4, in the same manner as in eleventh embodiment.

(4) Next, by applying a laser annealing process only to the pixel region 3*a* corresponding to the pixels on the phosphor layer 3, a crystalline distribution pattern in which the pixel region 3*a* forms a crystalline phase while the interpixel regions 3*b* form amorphous phase is formed within the in-plane of the phosphor layer 3.

(5) Next, a transparent electrode 2 is formed on the phosphor layer 3 by a sputtering method. As the material for the transparent electrode 2, ITO is used, and the transparent electrode 2 is formed as a linear pattern having a plurality of lines that are located in parallel with the surface of the glass substrate and extend in a second direction virtually orthogonal to the aforementioned first direction, in parallel with one another with predetermined intervals between one another.

(6) Next, after film-forming SiN as a protective layer 18 from the phosphor layer 3 or the transparent electrode 2, a black matrix 19 is formed by a photolithography method by using a resin material containing carbon black. The black matrix 19 is disposed virtually in a lattice shape by using a plurality of linear patterns that extend in the first direction in parallel with the surface of the glass substrate 1, between gaps of the back electrodes 4, and a plurality of linear patterns that extend in the second direction between gaps of the adjacent transparent electrodes 2.

(7) Next, after forming the color conversion layer 16 by inkjet method, by using color resists, colored patterns are formed between adjacent matrix lines of the black matrix 19 by a photolithography method. These processes are repeatedly carried out for the respective colors of R, G and B so that a color filter 17 is formed.

(8) Next, an insulating protective layer 11 is formed on the color filter 17 by using an epoxy resin.

By using the above-mentioned processes, a top-emission-type display device 20 of the present embodiment is obtained.

Figure 62:
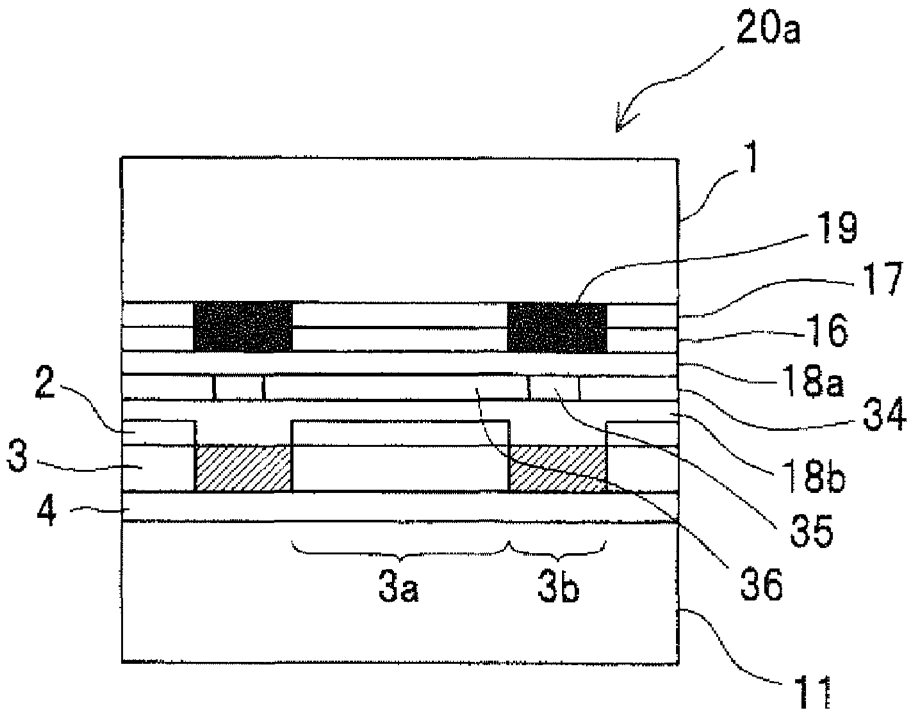
FIG. 62 is a schematic cross-sectional view that shows a structure of a modified example of a display device in accordance with fifteenth embodiment of the present invention.

Additionally, as shown in FIG. 62, the color filter 17, formed on the glass substrate 1, and a color conversion layer 16 are bonded to each other with an adhesive layer 34 interposed therebetween so that a top-emission-type display device 20*a* of another example may be manufactured. In this case, a protective layer 18*b* is formed on the transparent electrode 2, and a protective layer 18*a* is formed on the color conversion layer 16, and by forming the adhesive layer 34 on either one of the respective protective layers 18*a* and 18*b*, the protective layers may be bonded to each other. The adhesive layer 34 includes an adhesive 35 and a filler 36.

<Effects>

In the display device in accordance with the present embodiment, over the same plane of the phosphor layer 3, the phosphor layer 3*b* in the interpixel region between the adjacent pixel regions 3*a* is made to have higher resistance than that of the phosphor layer 3*a* in the pixel region so that even with a display device using a low resistance phosphor layer that exhibits electroluminescent light emission, it is possible to greatly reduce crosstalk at the time of a displaying operation, and consequently to improve the display quality.

Sixteenth Embodiment

<Schematic Structure of Display Device>

Figure 63:
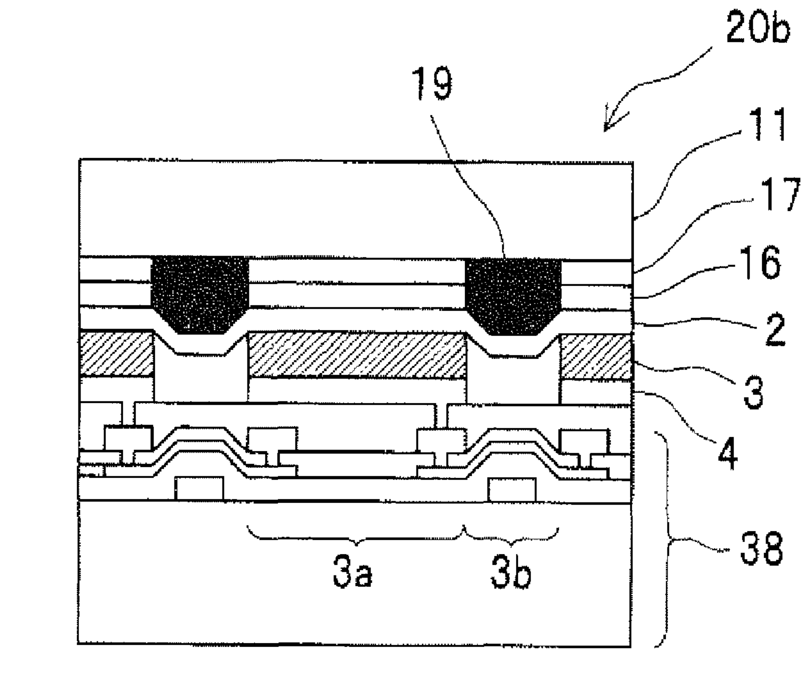
FIG. 63 is a schematic cross-sectional view that shows a structure of a display device in accordance with sixteenth embodiment of the present invention.
Figure 64:
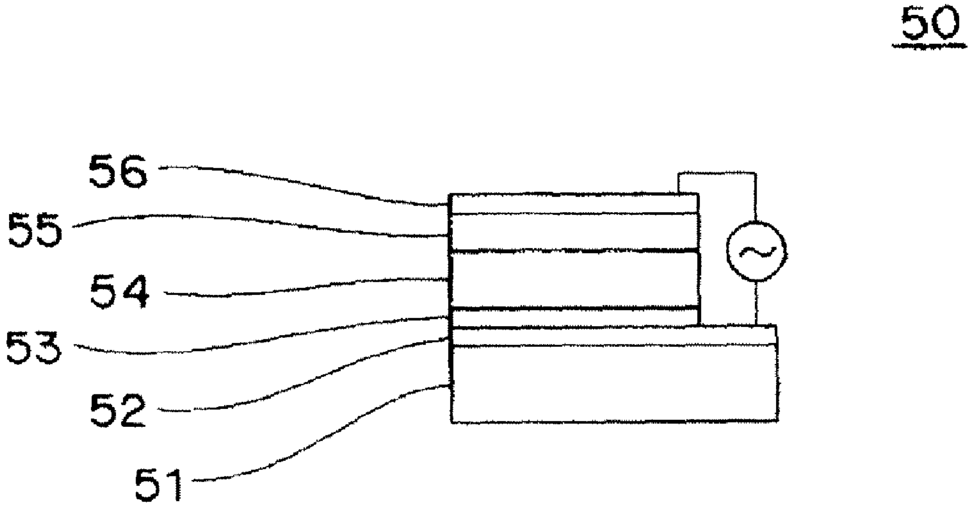
Fig. 64 PRIOR ART
FIG. 64 is a schematic cross-sectional view that shows a conventional inorganic EL element viewed in a direction perpendicular to the light-emitting face thereof.

FIG. 63 is a cross-sectional view that shows a structure of a display device 20*d* in accordance with sixteenth embodiment. This display device 20*d* is an active-driving type display device that uses a substrate 38 (hereinafter, referred to as "TFT substrate") in which a thin-film transistor for use in switching is installed in each of the pixels. This display device 20*b* is formed by successively stacking a back electrode 4, a phosphor layer 3 in a solid state and a transparent electrode 2 in a solid state, each installed in each pixel, on the TFT substrate 38. This display device 20*b* has a top-emission-type structure in which light emission is taken out from the transparent electrode 2 side. In this structure, virtually the same members as those of first embodiment and the same manufacturing method as that of eleventh embodiment may be used, except that the TFT substrate 38 is used.

In the same manner as in the display device of eleventh embodiment, the display device 20*b* makes it possible to greatly reduce crosstalk at the time of a displaying operation, and consequently to improve the display quality.

Although the present invention has been described above in detail by way of preferred embodiments thereof, the invention is not limited to the above embodiments, and various changes and modifications as would be obvious to one skilled in the art are intended to be included within the technical scope of the following claims.

The display device of the present invention, which uses a light-emitting element that can be driven at a low voltage, and has high luminance and high efficiency, makes it possible to provide a display device that can prevent crosstalk and achieve high display quality. The present invention is effectively used for providing a high-quality display device, such as a high-quality television.

This application claims priority on Japanese Patent Application No. 2007-43956 filed in Japan on Feb. 23, 2007 and Japanese Patent Application No. 2007-46986 filed in Japan on Feb. 27, 2007, the entire contents of which are hereby incorporated by reference.

The invention claimed is:

1. A display device comprising:

a pair of a first electrode and a second electrode, at least one electrode of the first and second electrodes being transparent or translucent; and a phosphor layer provided as being sandwiched between the first electrode and the second electrode, wherein the phosphor layer has a polycrystal structure made of a first semiconductor substance in which a second semiconductor substance different from the first semiconductor substance is segregated on a grain boundary of the polycrystal structure, and wherein the phosphor layer has a plurality of pixel regions that are selectively allowed to emit light in a predetermined range thereof and non-pixel regions that divide at least one portion of the pixel regions.

2. The display device according to claim 1, wherein the pixel regions and the non-pixel regions are periodically distributed over the same plane of the phosphor layer with the pixel regions being divided by the non-pixel regions.

3. The display device according to claim 1, wherein the non-pixel regions are provided to divide the pixel regions into a stripe shape.

4. The display device according to claim 1, wherein the non-pixel regions include discontinuous regions of the phosphor layer having the pixel regions.

5. The display device according to claim 1, wherein the non-pixel regions include one portion of the first electrode or the second electrode that divides at least one portion of the phosphor layer having the pixel regions.

6. The display device according to claim 1, wherein the non-pixel regions are made of regions having higher resistance than that of the pixel regions.

7. The display device according to claim 6, wherein each of the non-pixel regions is a void region that is in a vacuum state or filled with a nonvolatile gas.

8. The display device according to claim 6, wherein the non-pixel regions are solid-state regions mainly including an insulating resin.

9. The display device according to claim 1, wherein the phosphor layer contains one or more elements selected from the group consisting of Ag, Cu, Ga, Mn, Al and In, and the non-pixel regions have a different content density of the element from that of the pixel regions.

10. The display device according to claims 9, wherein the phosphor layer is made of a compound semiconductor.

11. The display device according to claim 1, wherein the pixel regions are formed by crystalline phase of the material of the phosphor layer, and the non-pixel regions are formed by amorphous phase of the material of the phosphor layer.

12. The display device according to claim 1, wherein the first semiconductor substance and the second semiconductor substance have semiconductor structures having respectively different conductivity types.

13. The display device according to claim 1, wherein the first semiconductor substance has an n-type semiconductor structure and the second semiconductor substance has a p-type semiconductor structure.

14. The display device according to claim 1, wherein the first semiconductor substance and the second semiconductor substance are compound semiconductors respectively.

15. The display device according to claim 1, wherein the first semiconductor substance is a compound semiconductor including elements belonging to Group 12 to Group 16.

16. The display device according to claim 1, wherein the first semiconductor substance has a cubic structure.

17. The display device according to claim 1, wherein the first semiconductor substance contains at least one element selected from the group consisting of Cu, Ag, Au, Al, Ga, In, Mn, Cl, Br, I, Li, Ce, Pr, Nd, Pm, Sm, Eu, Gd, Tb, Dy, Ho, Er, Tm and Yb.

18. The display device according to claim 1, wherein the polycrystalline structure made of the first semiconductor substance has an average crystal grain size in a range from 5 to 50 nm.

19. The display device according to claim 1, wherein the second semiconductor substance contains at least one element selected from the group consisting of ZnS, ZnSe, ZnSSe, ZnSeTe, ZnTe, GaN and InGaN.

20. The display device according to claim 1, wherein the first semiconductor substance is a zinc-based material containing zinc, and at least one of the electrodes is made of a material containing zinc.

21. The display device according to claim 20, wherein the material containing zinc forming one of the electrodes mainly includes zinc oxide, and contains at least one element selected from group consisting of aluminum, gallium, titanium, niobium, tantalum, tungsten, copper, silver and boron.

22. The display device according to claim 1, further comprising:

a supporting substrate that faces at least one of the electrodes, and supports the electrodes.

* * * * *